(12) United States Patent
Higashitani et al.

(10) Patent No.: US 6,750,103 B1
(45) Date of Patent: Jun. 15, 2004

(54) NROM CELL WITH N-LESS CHANNEL

(75) Inventors: Masaaki Higashitani, Sunnyvale, CA (US); Mark Randolph, San Jose, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 10/086,112

(22) Filed: Feb. 27, 2002

(51) Int. Cl.[7] ............................................. H01L 21/8247
(52) U.S. Cl. ........................................ 438/261; 438/954
(58) Field of Search ................................ 438/257–267, 438/954

(56) References Cited

U.S. PATENT DOCUMENTS

| | | | | |
|---|---|---|---|---|
| 6,261,904 B1 | * | 7/2001 | Pham et al. | 438/257 |
| 6,403,420 B1 | * | 6/2002 | Yang et al. | 438/261 |
| 6,468,865 B1 | * | 10/2002 | Yang et al. | 438/262 |
| 6,531,350 B2 | * | 3/2003 | Satoh et al. | 438/197 |
| 6,562,683 B1 | * | 5/2003 | Wang et al. | 438/258 |

\* cited by examiner

*Primary Examiner*—Richard A. Booth

(57) ABSTRACT

A method of fabricating nitride read-only memory (NROM) cells and arrays. The memory device is formed on a substrate. Each memory cell comprises a pair of bit lines extending in a first direction across the substrate, a pair of bit line dielectrics overlaying and covering the pair of bit lines, a charge-trapping layer formed over the channel region between the pair of bit lines, and a conductive connecting block formed on the charge-trapping layer. The charge-trapping layer comprising two oxide-nitride-oxide (ONO) structures separated by a gate oxide layer, where each ONO structures comprises a layer of nitride sandwiched between a bottom oxide layer and a top oxide layer. A plurality of straight, parallel-edged word lines extend across the substrate in a second direction and cross over the bit lines and channel regions. Each word line comprises a conductive material and is separated from the substrate by the conductive connecting blocks and bit lines dielectrics.

22 Claims, 26 Drawing Sheets

NROM CELL WITH N-LESS CHANNEL

BACKGROUND

The present invention relates generally to methods of fabrication of nitride read only memory (NROM) cells and arrays.

FIG. 1 illustrates a typical NROM cell. This cell includes a substrate 10 in which are implanted a bit line source 12 and drain 14 and on which lies an oxide-nitride-oxide (ONO) structure 16 having a layer of nitride 17 sandwiched between a lower oxide layer 18 and an upper oxide layer 20. On the ONO structure 16 lies a polysilicon connecting block 26, which functions as a gate conductor. On the source 12 and drain 14 are isolated oxide areas 62, which function as insulators. Between the source 12 and drain 14 is a channel 15 under the ONO structure 16.

The nitride section 17 provides the charge retention mechanism for programming the memory cell. Specifically, when programming voltages are provided to the source 12, drain 14 and gate conductor 26, electrons flow towards the drain 14. According to the hot electron injection phenomenon, some hot electrons penetrate through the lower section of silicon oxide 18, especially if the section 18 is thin, and are then collected in the nitride section 17. As is known in the art, the nitride section 17 retains the received charge, labeled 24, in a concentrated area adjacent the drain 14. The concentrated charge 24 significantly raises the threshold of the portion of the channel of die memory cell under the charge 24 to be higher than the threshold of the remaining portion of the channel 15.

When concentrated charge 24 is present (i.e. the cell is programmed), the raised threshold of the cell does not permit the cell to be placed into a conductive state during reading of the cell. If concentrated charge 24 is not present, the read voltage on gate conductor 22 can overcome the much lower threshold and accordingly, channel 15 becomes inverted and hence, conductive. It is noted that the threshold voltage $V_{th}$ of NROM cells is generally very sensitive to the voltages $V_{drain}$ and $V_{gate}$ provided on the drain 14 and on the gate conductor 26, respectively.

FIGS. 2–5 illustrate a conventional approach to forming the NROM cell of FIG. 1. The process begins by thermally growing a lower layer of silicon oxide 18 on a P-type silicon substrate 10. Then, a silicon nitride layer 17 is deposited by LPCVD and the wafer is steam-sealed to form the upper silicon oxide layer 20. Next, a doped layer of polysilicon is deposited over the wafer to a depth of about 4,000 angstroms. The polysilicon layer is patterned to form polysilicon connecting blocks 26, with openings 30 in between.

A heavy dosage of arsenic 36 is then implanted into the wafer to form heavily doped, N-type, bit line areas 38. The polysilicon connecting blocks 26 are used for connecting to conductive word lines which are common to other similar memory cells in the rows. Also, the polysilicon connecting blocks 26 function as masks to prevent the arsenic implant from reaching the underlying channel areas 15.

The wafer is then subjected to an etch for removing portions of the oxide-nitride-oxide layers 18, 17, and 20 which are not covered by the polysilicon connecting blocks 26. The remaining oxide-nitride-oxide layers 18, 17, and 20 are self-aligned with respect to the side edges of the overlying polysilicon connecting blocks 26, as illustrated in FIG. 2.

The process continues with the deposition of a layer of conformal silicon oxide 52, such as tetra-ethoxysilane (TEOS), over the surface of the wafer to a depth of about 5,000 angstroms. A layer of photoresist 54 is then spun over the surface of the wafer for filling the contoured surface of the conformal silicon oxide layer 52, and for providing a flat top surface. The wafer may be heated to a temperature effective to anneal the implant and activate the impurities to form diffused bit line regions 56, shown in FIG. 3. The diffused bit line regions 56 are elongate and are associated with other cells in the columns of the memory array.

An etching process is then employed for etching the photoresist 54 and the conformal silicon oxide layer 52 at the same rate. When such an etch is conducted, the removal of material proceeds uniformly downwardly, until the polysilicon connecting blocks 26 are reached. The top surface of the polysilicon connecting blocks 26 are planarized with respect to the top surface of the conformal silicon oxide layer 52, forming isolated oxide areas 62. The result is a planarized surface of the memory array, illustrated in FIG. 4.

Finally, a second layer of doped polysilicon 68 is deposited over the surface of the wafer, as shown in FIG. 5, and patterned to define a word line extending in common with a number of other memory cells of the row. Importantly, the polysilicon word line 68 is in electrical contact with the first polysilicon layer forming the conductive connecting blocks 26. Thus, when an address signal is applied to the word line 68, such signal is applied simultaneously to the polysilicon connecting blocks 26 which function as gate conductors. All memory cells connected to the word line 68 which are not programmed with a concentrated charge on the silicon nitride layer 17 will conduct and present a low impedance between the associated pair of bit lines. Those memory cells in the row which are programmed so as to have a concentrated charge on the silicon nitride layer 17 will not be made conductive and thus will present a high impedance between the associated bit lines.

BRIEF SUMMARY

In one aspect, the present invention is an electrically programmable read-only memory device including an array of single transistor memory cells where each of said cells is read, programmed, and erased through a pair of associated bit lines and a single associated word line. The memory device is formed on a substrate. Each memory cell comprises a pair of bit lines extending in a first direction across the substrate, a pair of bit line dielectrics overlaying and covering the pair of bit lines, a charge-trapping layer formed over the channel region between the pair of bit lines, and a conductive connecting block formed on the charge-trapping layer. The charge-trapping layer comprises two oxide-nitride-oxide (ONO) structures separated by a gate oxide layer, where each ONO structures comprises a layer of nitride sandwiched between a bottom oxide layer and a top oxide layer. A plurality of straight, parallel-edge-word lines extend across the substrate in a second direction and cross over the bit lines and channel regions. Each word line comprises a conductive material and is separated from the substrate by the conductive connecting blocks and bit line dielectrics.

In a second aspect, the present invention concerns a first method of fabricating a nitride read only memory (NROM) chip. The method comprises creating an oxide-conductive layer on a substrate, where the oxide-conductive layer is formed of a first conductive layer on top of a thick oxide layer, laying down a bit line mask of photoresist generally in columns at least within a memory portion of the chip; removing at least a portion of the oxide-conductive layer wherever the photoresist is not present to form oxide-conductive-layer columns; implanting bit lines wherever the photoresist is not present and generally in columns; removing the photoresist; removing a portion of the remaining thick oxide layer from the oxide-conductive-layer columns to produce a recess; growing a thin oxide layer over the memory portion of the chip; depositing a nitride layer over the thin oxide layer to a thickness sufficient to fill the recess; removing the nitride layer except in the region or the recess; forming bit line dielectrics on top of the bit lines; and forming rows of a second conductive layer perpendicular to and on top of the bit line dielectrics and oxide-conductive-layer columns.

In a third aspect, the present invention concerns a second method of fabricating a nitride read only memory (NROM) chip. The method comprises creating an oxide-conductive layer on a substrate, where the oxide-conductive layer is formed of a first conductive layer on top of a thick oxide layer; laying down a bit line mask of photoresist, the bit line mask formed generally in columns at least within a memory portion of the chip; removing at least a portion of the oxide-conductive layer wherever the photoresist is not present to form a plurality of oxide-conductive-layer columns; implanting bit lines wherever the photoresist is not present and generally in columns; removing the photoresist; forming an oxide-nitride-oxide (ONO) layer within the memory portion of the chip, where the ONO layer comprises a bottom oxide layer, a nitride layer, and a top oxide layer; removing The ONO layer except from the regions adjacent to the oxide-conductive-layer columns to form pairs of ONO structures separated by oxide-conductive-layer columns; forming bit line dielectrics on top of the bit lines and ONO structures; and forming rows of a second conductive layer perpendicular to and on top of the bit line dielectrics and oxide-conductive-layer columns.

Definitions

The term "substrate" refers to any semiconductor material conventionally known to those of ordinary skill in the art. Examples include silicon, gallium arsenide, germanium, gallium nitride, aluminum phosphide, and alloys such as $Si_{1-x}Ge_x$ and $Al_xGa_{1-x}As$, where $0 \leq x \leq 1$. Many others are known, such as those listed in Semiconductor Device Fundamentals, on page 4, Table 1.1 (Robert F. Pierret, Addison-Wesley, 1996). Preferably, the semiconductor substrate is silicon, which may be doped or undoped.

The term "planarizing" means to remove material, preferably in the vertical direction, enhancing the flatness of the structure being planarized.

The term "adjacent" means that there are no functional structures between the specified structures. A functional structure is a structure intentionally placed on a semiconductor device that affects the function of the device. For example, a functional structure may mean a structure having a predetermined set of dimensional and/or compositional parameter values that has an electrical, mechanical and/or optical function (e.g., conductive, insulative, masking, photolithographic, or antireflective).

The term "oxide" refers to a metal oxide conventionally used to isolate electrically active structures in an integrated circuit from each other, typically an oxide of silicon and/or aluminum (e.g., $SiO_2$ or $Al_2O_3$, which may be conventionally doped with fluorine, boron, phosphorus or a mixture thereof; preferably $SiO_2$ or $SiO_2$ conventionally doped with 1–12 wt % of phosphorous and 0–8 wt % of boron).

The term "dielectric layer" refers to any dielectric material conventionally known to those of ordinary skill in the art. Examples include conventional oxides, nitrides, oxynitrides, and other dielectrics, such as borophosphosilicate glass (BPSG), borosilicate glass (BSG), phosphosilicate glass, spin-on glass (SOG), silicon oxide, P-doped silicon oxide (P-glass), and silicon nitride, for example $SiO_2$, $Si_3N_4$, $Al_2O_3$, $SiO_xN_y$, etc.

BRIEF DESCRIPTION OF SEVERAL VIEWS OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein.

DETAILED DESCRIPTION OF THE PRESENTLY PREFERRED EMBODIMENTS

Figure 1:
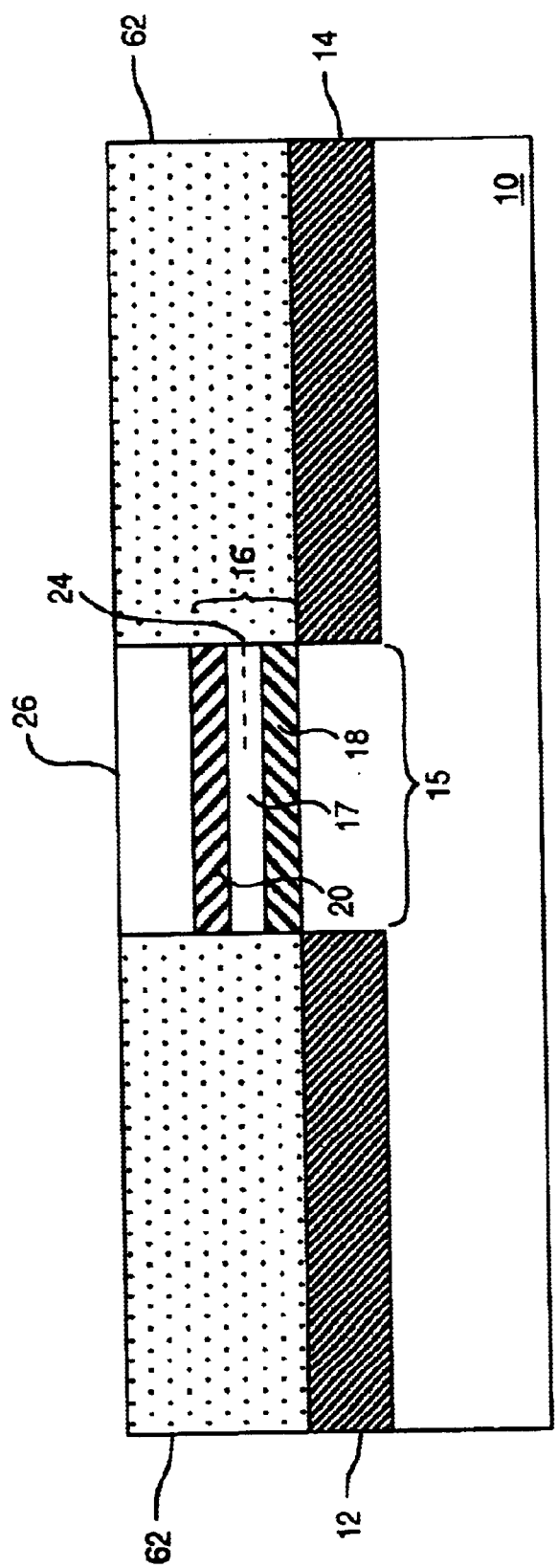
FIG. 1 is a schematic illustration of a prior art NROM memory cell.
Figure 2:
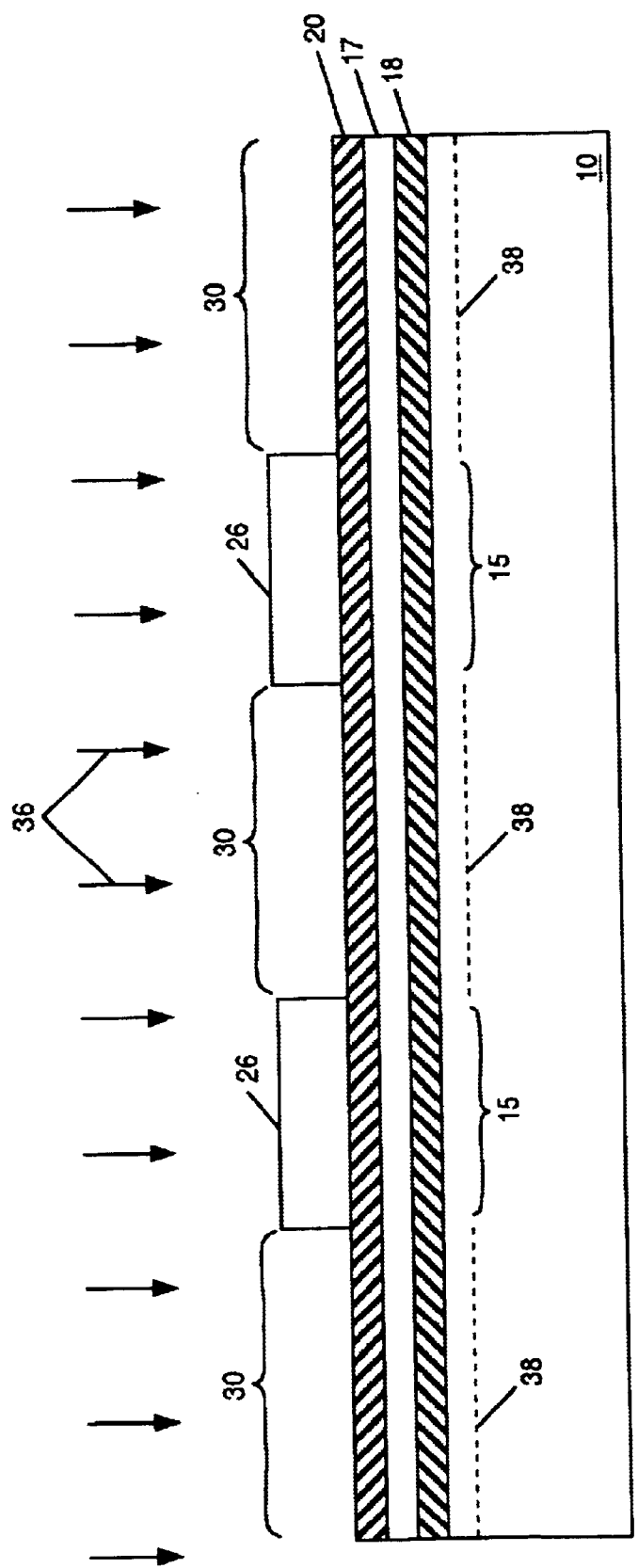
FIGS. 2–5 illustrate sectional views of the NROM cell of FIG. 1, taken during various process steps of the fabrication thereof.
Figure 3:
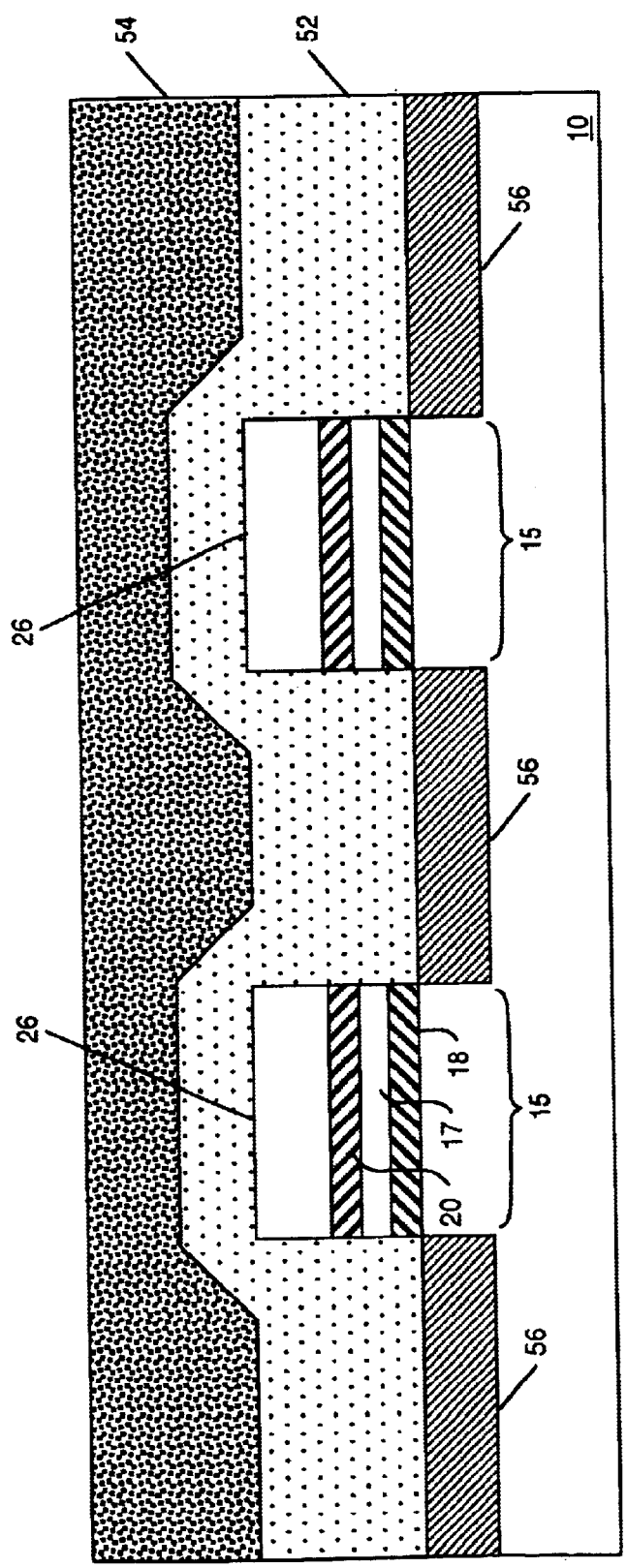
Figure 4:
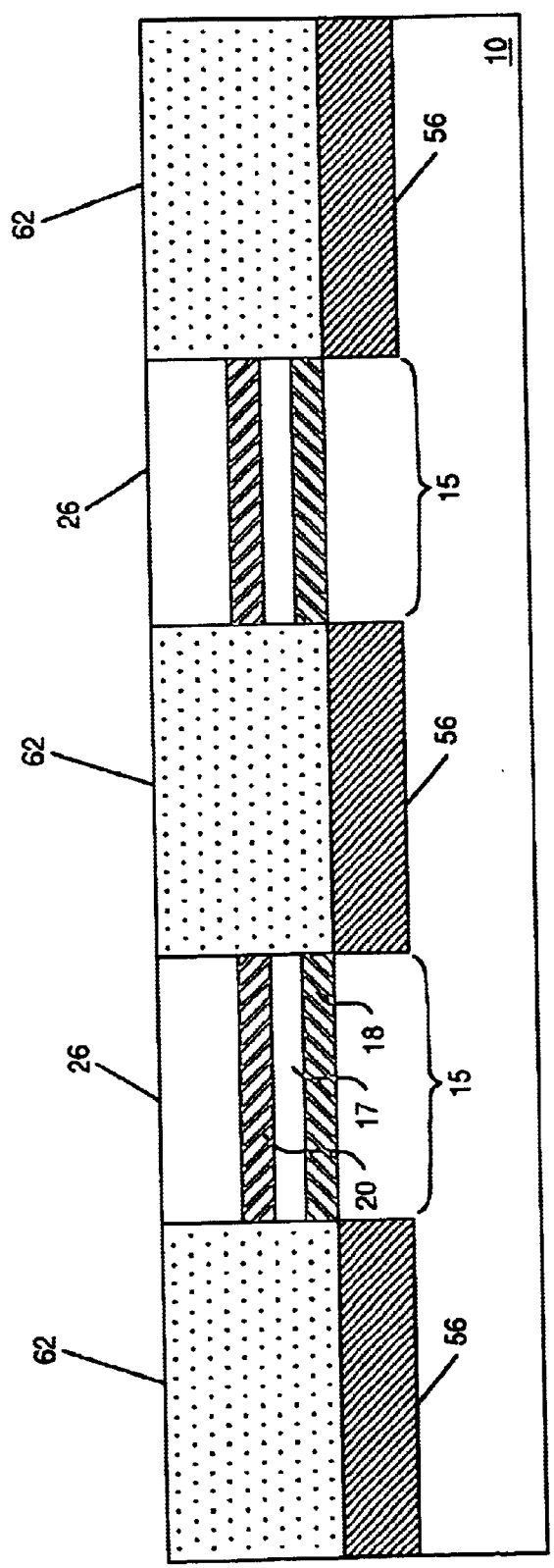
Figure 5:
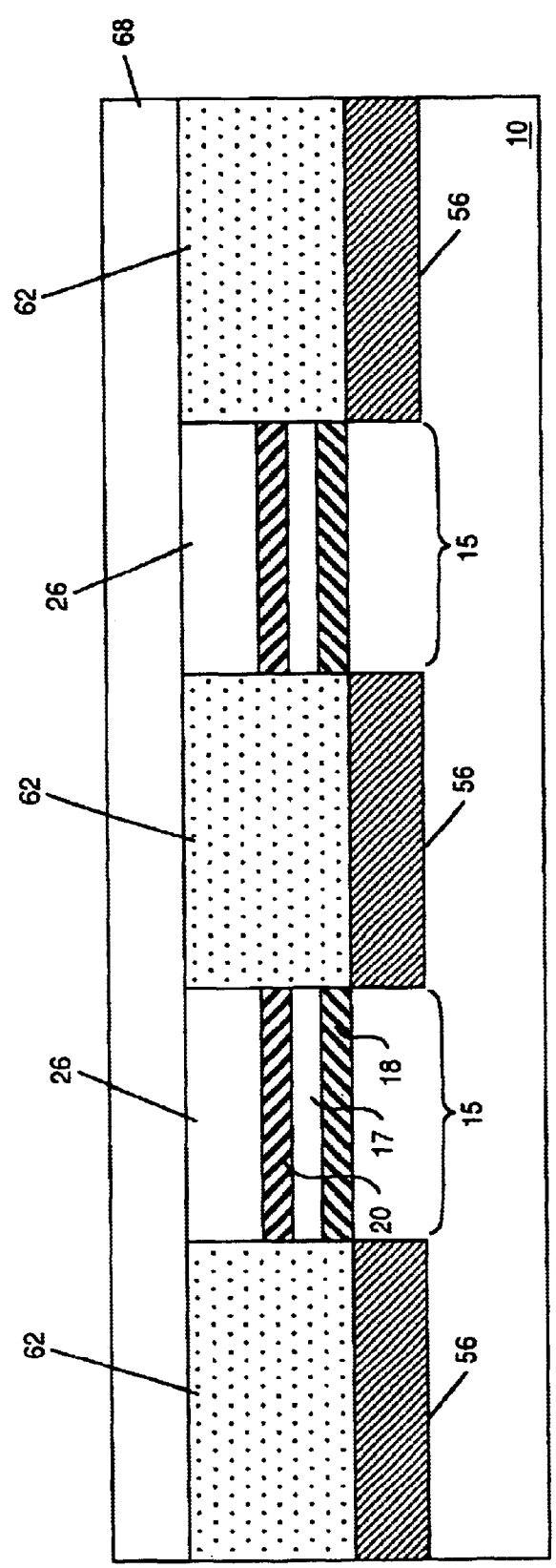
Figure 6:
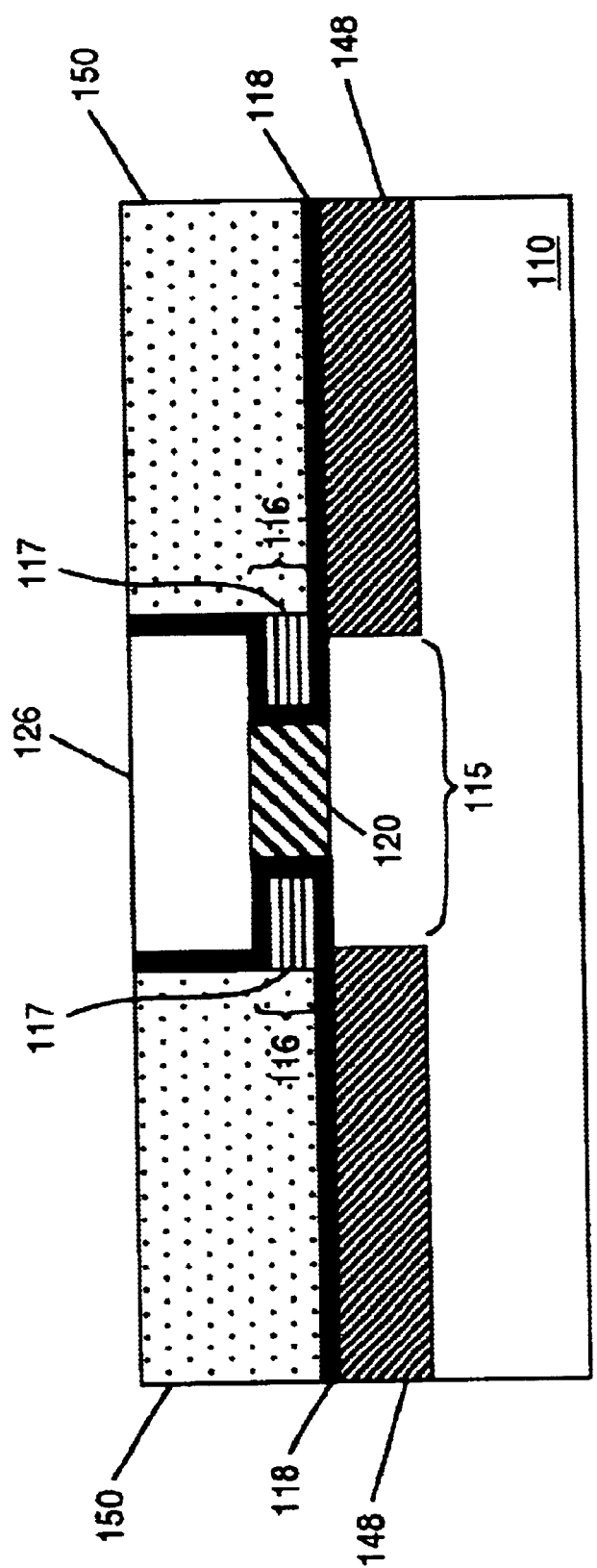
FIG. 6 is a schematic illustration of the NROM memory cell according to a first embodiment of the present invention.

FIG. 6 illustrates an NROM cell according to a first embodiment of the present invention. This cell includes a substrate 110 in which are implanted source/drain bit lines 148 and on top of which lies a charge trapping layer, comprising a pair of oxide-nitride-oxide (ONO) structures 116 separated by a gate oxide layer 120. Preferably, the first ONO structure 116 is on a first portion of the substrate 110, the second ONO structure 116 is on a second portion of the substrate 110, wherein the first portion does not completely overlap the second portion, as illustrated in FIG. 6. The first portion may overlap a portion of the second portion, so long as the first portion does not overlap the entire second portion. More preferably, the gate oxide 120 is on a third portion of the substrate, wherein the third portion does not completely overlap either the first or second portion. The first ONO structure 116 and the second ONO structure 116 do not form a stacked structure, that is, a structure wherein the first ONO layer 116 is on the second ONO structure 116. But rather, the first ONO structure 116 is laterally aligned with the second ONO structure 116, wherein the gate oxide layer 120 is located in between the first and second ONO structures 116, as illustrated in FIG. 6.

Gate oxide layer 120 includes any dielectric material conventionally known to those of ordinary skill in the art. Examples of dielectric material include conventional oxides, nitrides, oxynitrides, and other dielectrics, such as borophosphosilicate glass (BPSG), borosilicate glass (BSG), phosphosilicate glass, spin-on glass (SOG), silicon oxide, P-doped silicon oxide (P-glass), and silicon nitride, for example $SiO_2$, $Si_3N_4$, $Al_2O_3$, $SiO_xN_y$, etc. Each ONO structure comprises a nitride layer 117 sandwiched in a thin oxide layer 118. The charge-trapping layer is located above the channel 115, defined as that portion of the surface of the substrate 110 lying between a pair of bit lines 148. On top of the charge trapping layer lies a conductive connecting block 126, which functions as a gate conductor. On top of the bit lines 148 lie bit line dielectrics 150, which function as insulators. In this embodiment, the conductive connecting block 126 overlays and covers both the gate oxide layer 120 and the ONO structures 116.

Reference is now made to FIGS. 7–13, which illustrate the NROM fabrication method according to a first embodiment of the present invention. The process begins by growing a thick oxide layer 121 on a substrate 110, preferably to a thickness of 150–200 Å, and preferably in a low temperature oxidation operation. A preferable oxidation temperature is about 800 degrees C., but it can vary between 750 and 1000 degrees C. The substrate 110 is preferably a P-type silicon substrate of a <100> crystal lattice orientation.

Figure 7:
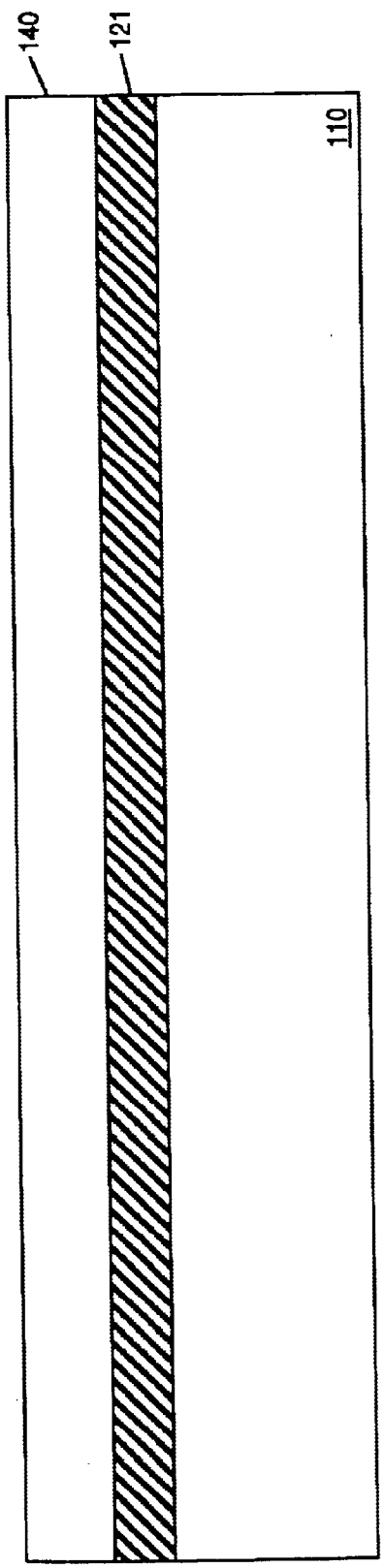
FIG. 7–13 illustrate sectional views of the NROM cell of FIG. 6, taken during various process steps of the fabrication thereof.

Then, a first conducting layer 140 is deposited over the wafer to a depth of 3000–5000 Å, resulting in the structure in FIG. 7. The first conducting layer is preferably polycrystalline silicon, more preferably doped polysilicon.

Figure 8A:
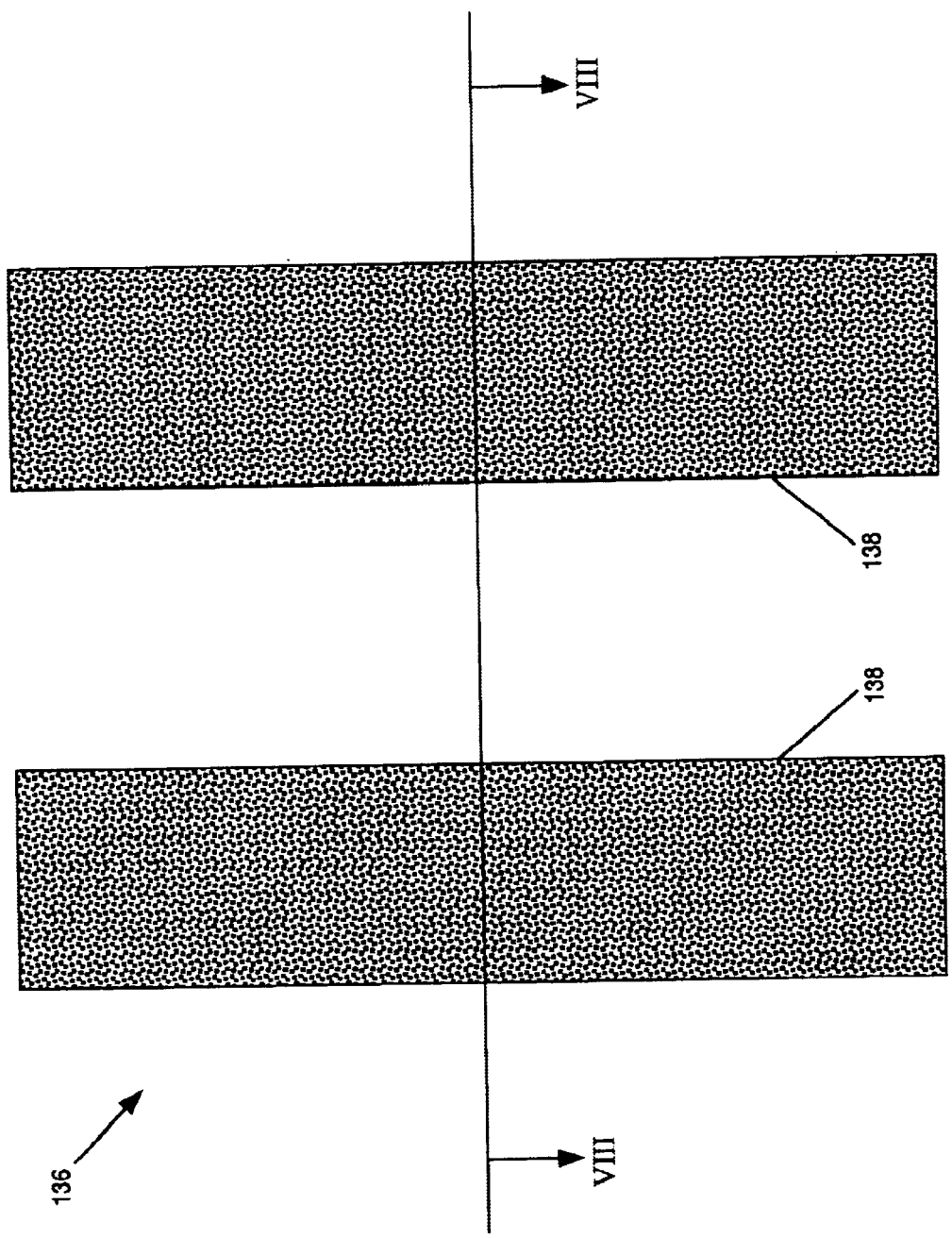
Figure 8B:
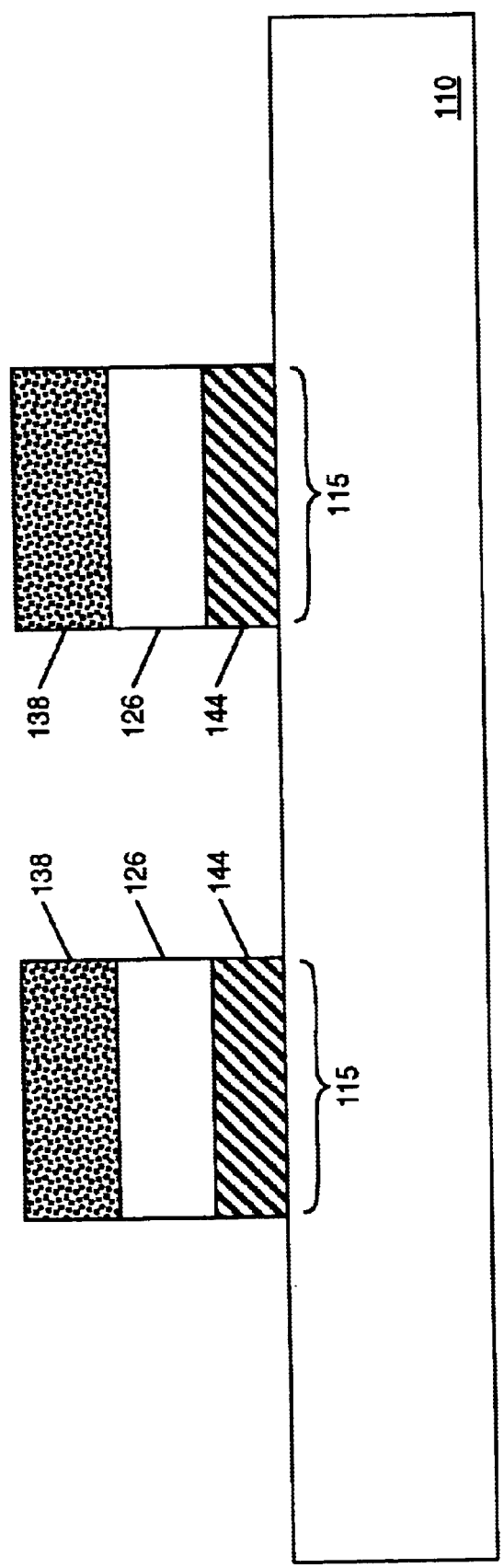
Figure 8C:
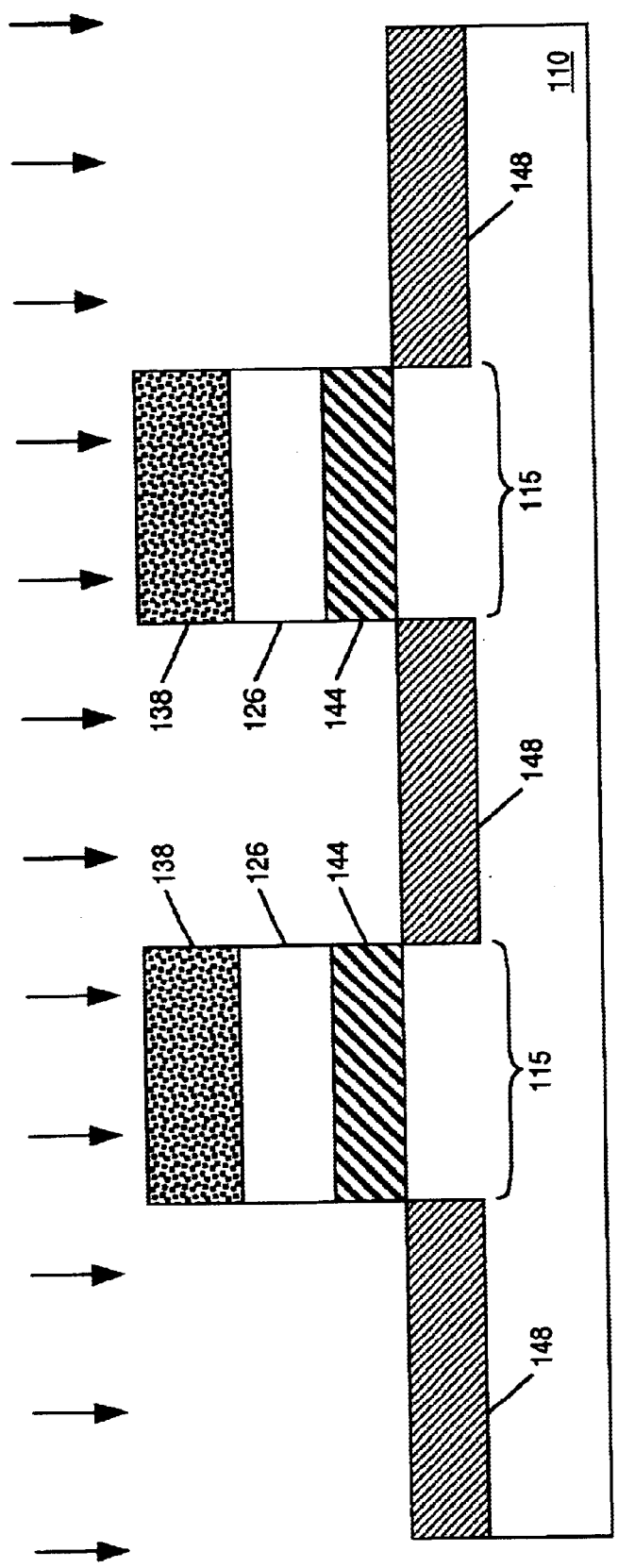

The next step involves depositing a photoresist layer and patterning it into columns 138 to form a bit line mask 136, whose layout within the memory array portion of the chip is shown from above in FIG. 8A. The photoresist columns 138 define the areas where the bit lines are not to be implanted (i.e. the locations of the channels 115 (FIG. 6)). Prior to implanting the bit lines, the thick oxide and first conducting layers 121 and 140, respectively, are etched away from the areas between photoresist columns 138 to from conductive connecting blocks 126 superposed on oxide blocks 144. The conductive connecting blocks 126 and oxide blocks 144 are self-aligned with respect to the side edges of the overlying photoresist columns 138, as illustrated in FIG. 8B.

After the etch operation, bit lines 148 are implanted (FIG. 8C) in the areas between the photoresist columns 138. A typical implant might be $2-4*10^{15}/cm^2$ of Arsenic at 50 Kev. It will be appreciated that this is a self-aligned implant in which the bit lines 148 are self-aligned to the photoresist columns 138. In addition, the bit line regions 148 are elongate and are associated with other cells in the columns of the memory array. Next, the first photoresist layer 138 is stripped and the surface is cleaned.

Figure 9:
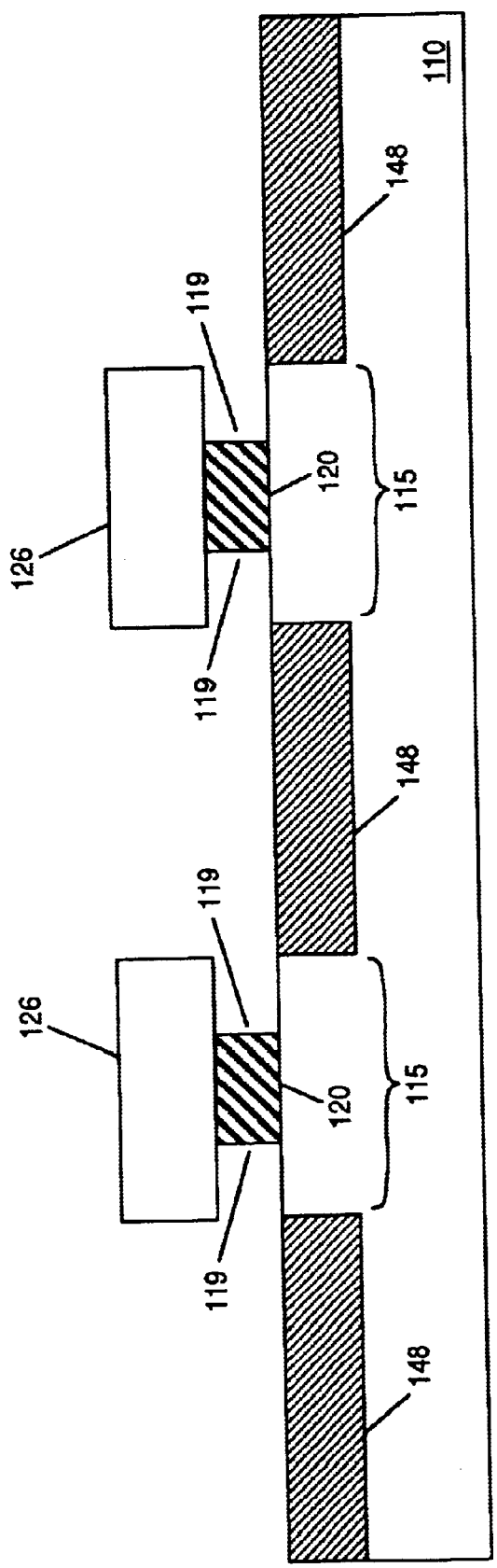

An isotropic HF etch is then performed to remove a portion of the oxide block 144 and produce a recess 119 and a gate oxide layer 120 over a channel 115, as illustrated in FIG. 9. The amount of oxide removed is typically 0.02–0.05 $\mu$, or approximately ¼ to ½ of the width of the conductive connecting block 126. If too much oxide is removed, the polysilicon connecting blocks 126 becomes unstable and can topple over.

Figure 10:
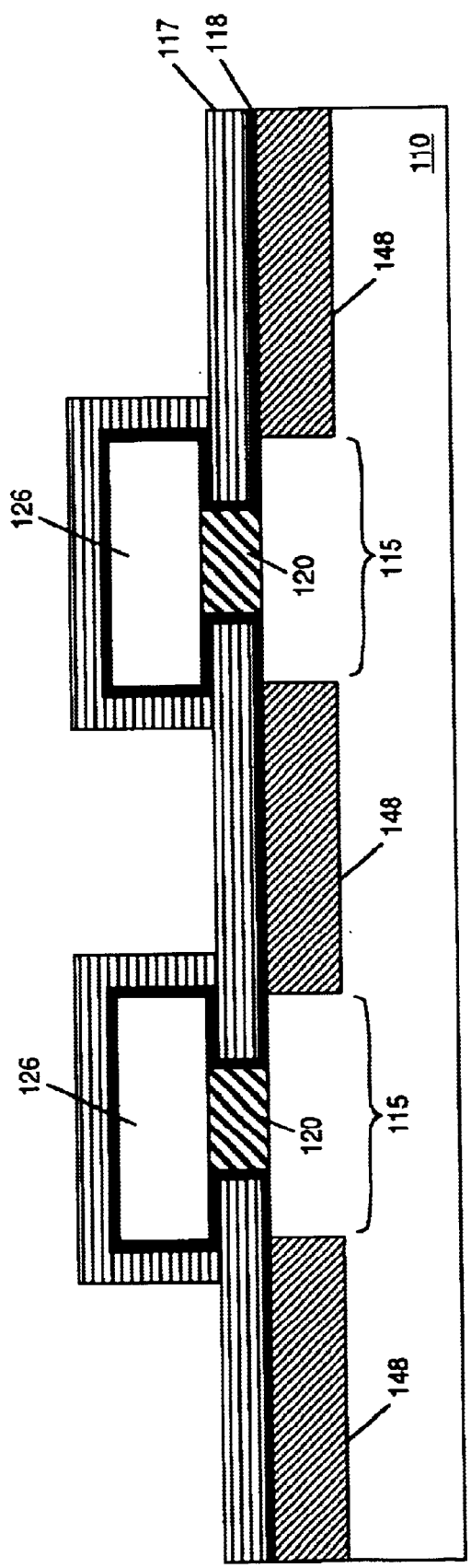

A thin oxide layer 118 is then grown over the wafer, typically to a thickness of 40–70 Å in a low temperature oxidation operation. A preferable oxidation temperature is about 800° C., but it can vary between 750–1000° C. A silicon nitride layer 117 is next deposited over the thin oxide layer 118 in a low temperature chemical vapor deposition (LPCVD) operation to a thickness of 50–70 Å. Importantly, the nitride layer 117 is grown to a thickness sufficient to fill the recess 119 under the conductive connecting blocks 146 resulting from the prior isotropic HF oxide etch. The LPCVD operation is typically conducted at a temperature of 650–750° C. and a pressure of 0.05–0.3 Torr using a gas mixture of $NH_3$ and $SiCl_2H_2$. Preferably, the temperature is 725° C. and the pressure is 0.2 Torr. The resulting structure is depicted in FIG. 10.

Figure 11:
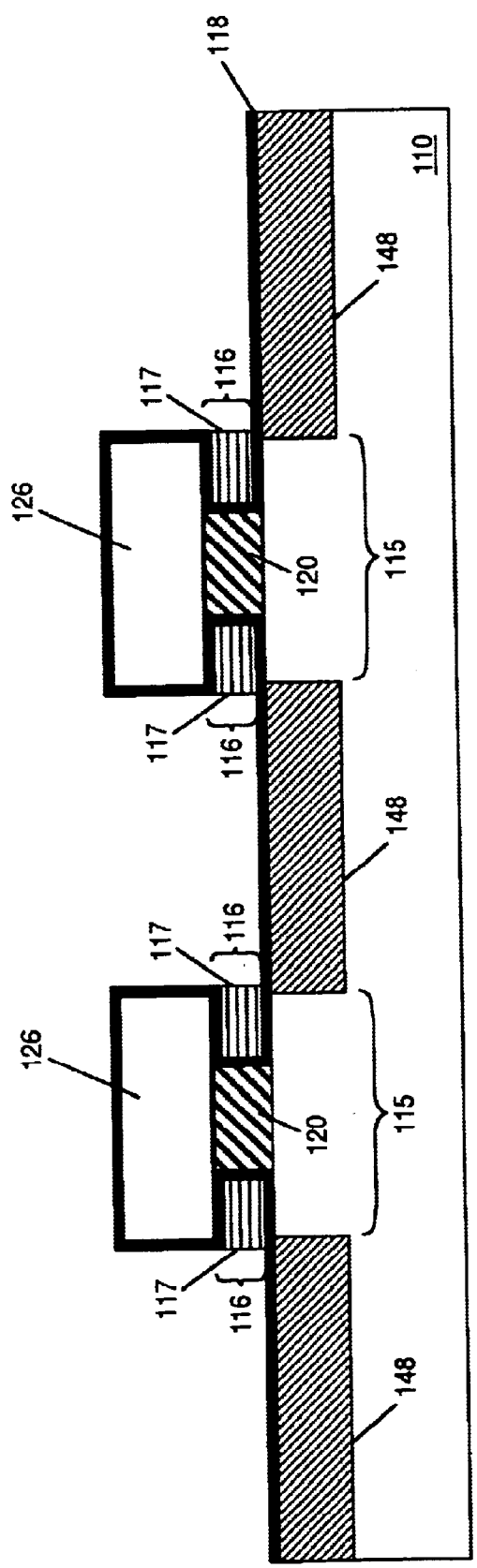
Figure 12:
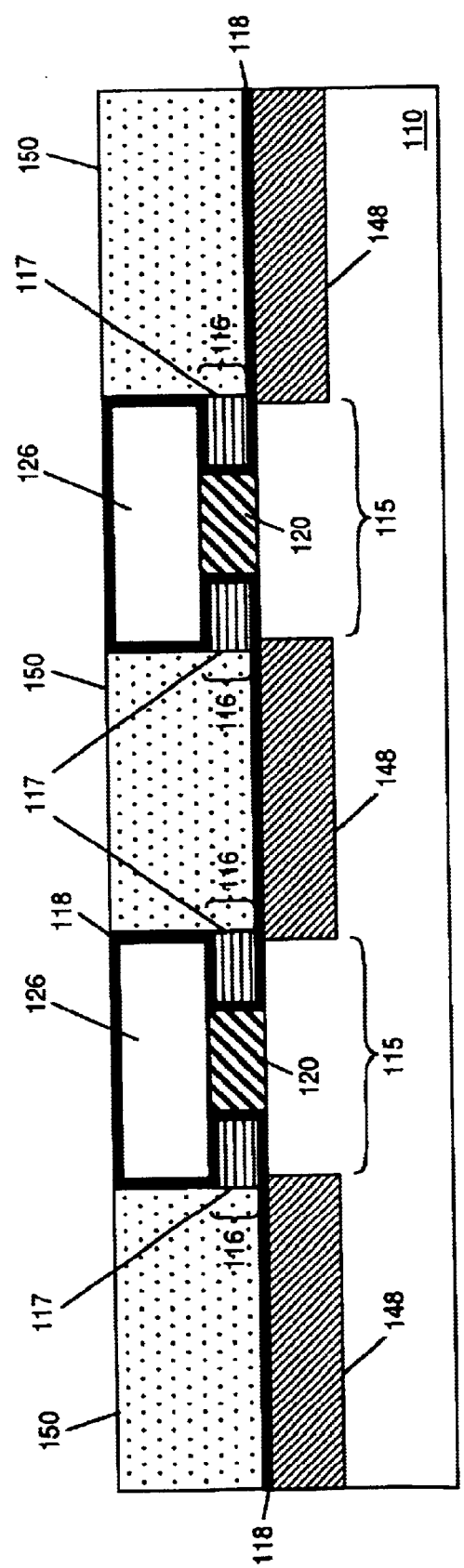

Afterwards, an anisotropic etch is performed to remove the nitride layer 117 from the surface of the chip, except from the recessed areas 119 (shown in FIG. 9). The thin oxide layer 118 is left essentially unperturbed by this operation. As shown in FIG. 11, this etch generates a charge-trapping layer located above a channel 115 and under a conductive connecting block 126, wherein the charge trapping layer comprises a pair of oxide-nitride-oxide (ONO) columns 116 separated by a gate oxide 120. Each ONO column comprises a nitride layer 117 sandwiched in a thin oxide layer 118.

This construction of the charge-trapping layer minimizes the cross-talk between source/drain bit line 148 pairs often associated with previous structures. As a result, the reliability and dynamic range (i.e. voltage required for a read/write operation) of the resulting device are significantly enhanced. Concurrently, the programming and erase time are advantageously decreased.

The process continues with the deposition of a dielectric layer, preferably conformal silicon oxide, over the surface of the chip to a depth of 4000–6000 Å. Preferably, tile deposition uses a high-density plasma or a conventional CVD method, for example, the thermal decomposition of tetra-ethyl orthosilicate (TEOS). Chemical mechanical polishing (CMP) is then employed to uniformly remove material in a downward direction until the conductive connecting blocks 126 are reached. The result is a planarized surface of the memory array, with bit line dielectrics 150 formed over the bit lines 148, illustrated in FIG. 12.

Figure 13A:
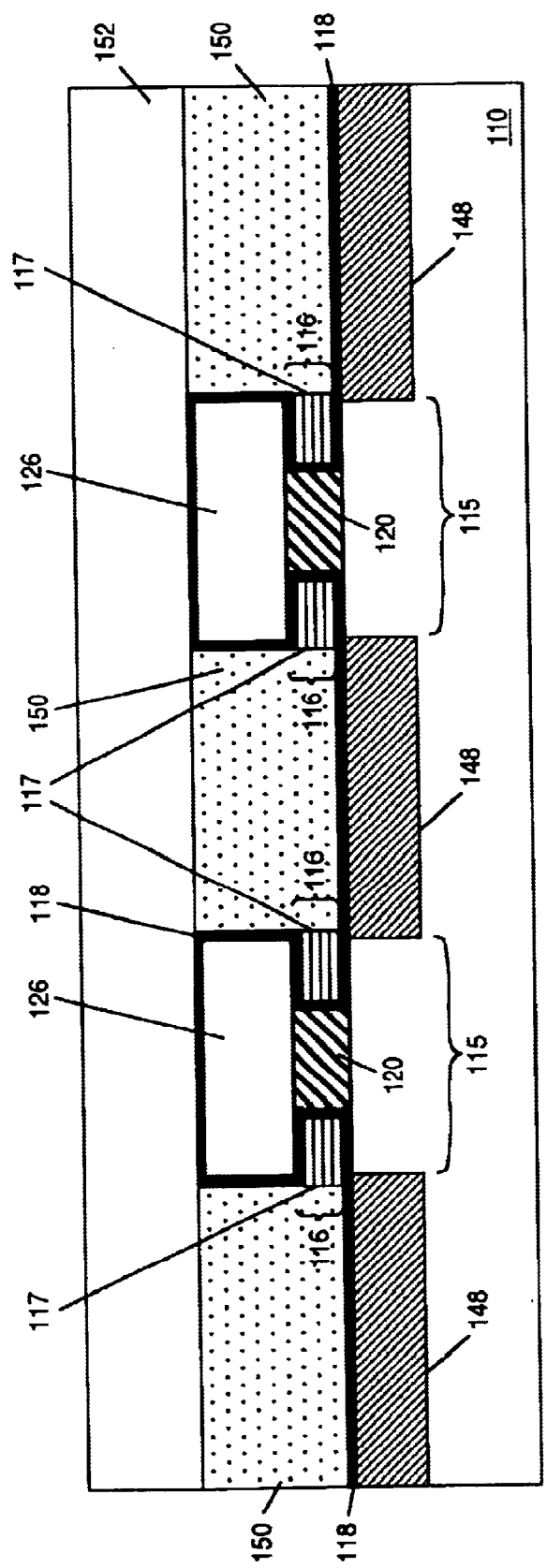
Figure 13B:
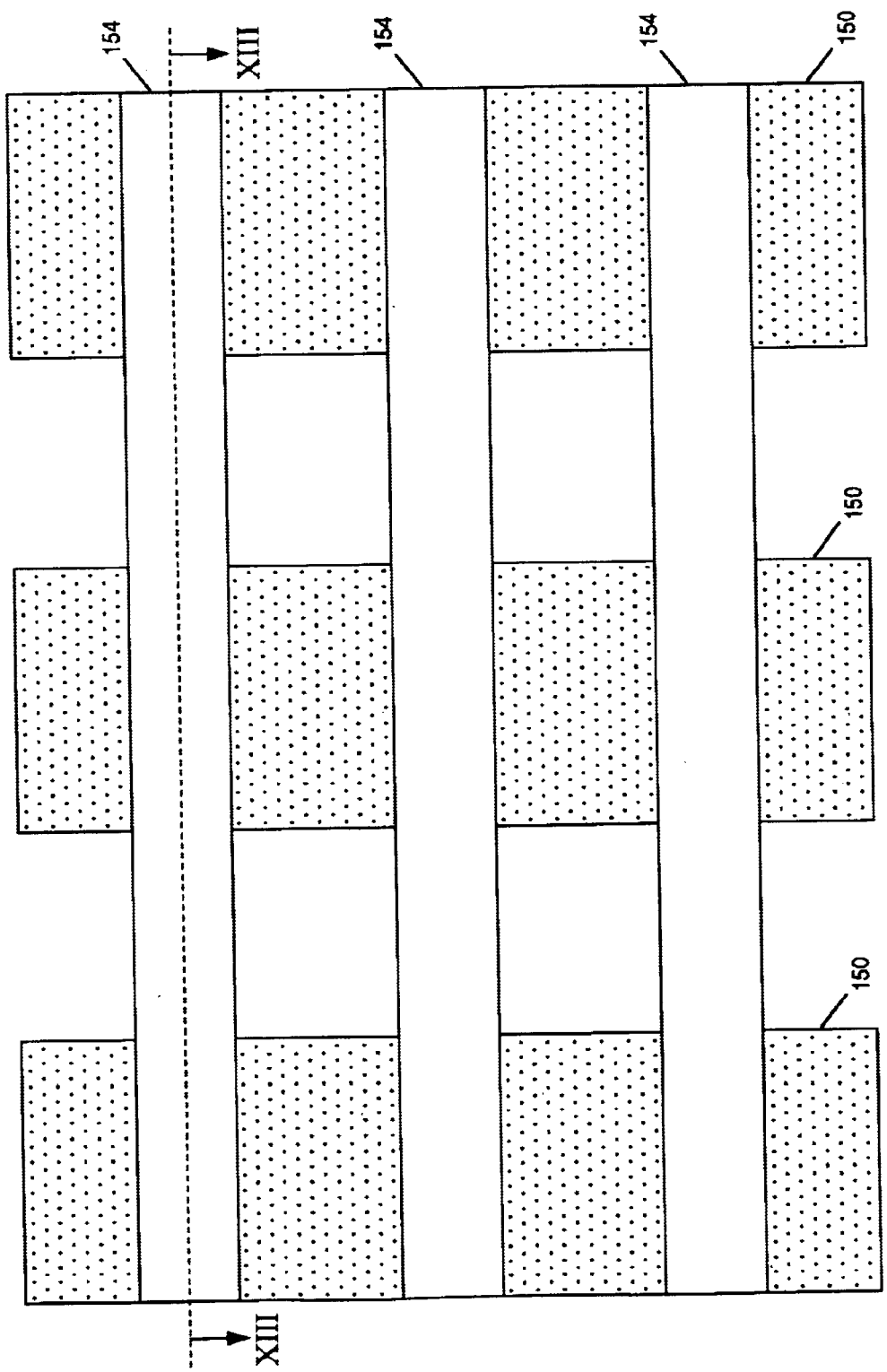

With reference now to FIG. 13A, a second conducting layer 152, preferably polycrystalline silicon, more preferably doped polysilicon, is deposited over the surface of the chip. Then, the conductive connecting blocks 126 and second conducting 152 layer are concurrently patterned to define a word line 154 (FIG. 13B viewed from above) extending in common with a number of other memory cells of the row. Importantly, the word line 154 is in electrical contact with the first conductive layer 140 forming the conductive connecting blocks 126. Thus, when an address signal is applied to the word line 154, such signal is applied simultaneously to the conductive connecting blocks 126, which function as gate conductors. All memory cells connected to the word line 154 which are not programmed with a concentrated charge on the silicon nitride layer 117 will conduct and present a low impedance between the associated pair of bit lines. Those memory cells in the row which are programmed so as to have a concentrated charge on the silicon nitride layer 117 will not be made conductive and thus will present a high impedance between the associated bit lines.

Figure 14:
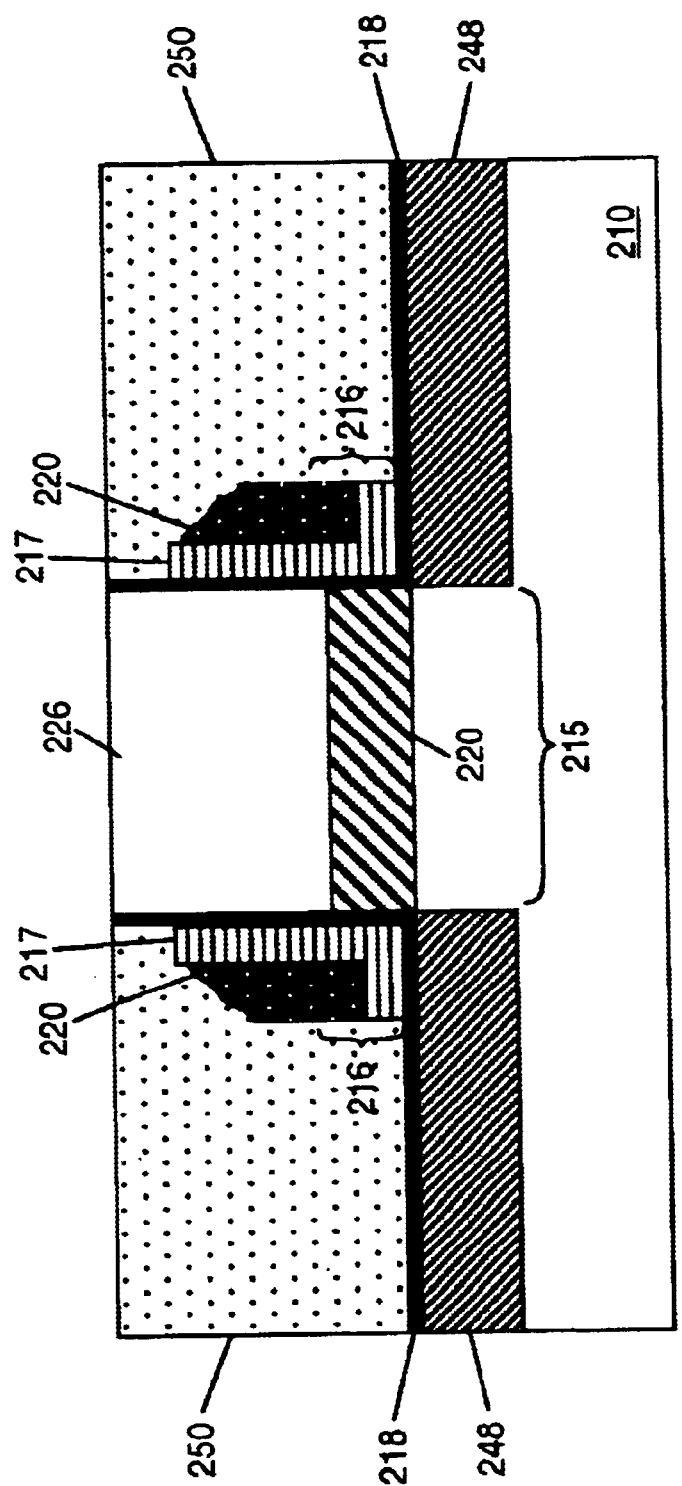
FIG. 14 is a schematic illustration of the NROM memory cell according to a second embodiment of the present invention.

FIG. 14 illustrates an NROM cell according to a second embodiment of the present invention. This cell includes a substrate 210 in which are implanted source/drain bit lines 248 and on top of which lies a charge trapping layer, comprising a pair of oxide-nitride-oxide (ONO) structures 216 separated by a gate oxide 220. Preferably, the first ONO structure 216 is on a first portion of the substrate 210, the second ONO structure 216 is on a second portion of the substrate 210, wherein the first portion does not completely overlap the second portion, as illustrated in FIG. 14. The first portion may overlap a portion of the second portion, so long as the first portion does not overlap the entire second portion. More preferably, the gate oxide 220 is on a third portion of the substrate, wherein the third portion does not completely overlap either the first or second portion. The first ONO structure 216 and the second ONO structure 216 do not form a stacked structure, that is, a structure wherein the first ONO layer 216 is on the second ONO structure 216. But rather, the first ONO structure 216 is laterally aligned with the second ONO structure 216, wherein the gate oxide layer 220 is located in between the first and second ONO structures 216, as illustrated in FIG. 14.

Gate oxide 220 includes any dielectric material conventionally known to those of ordinary skill in the art. Examples of dielectric material include conventional oxides, nitrides, oxynitrides, and other dielectrics, such as borophosphosilicate glass (BPSG), borosilicate glass (BSG), phosphosilicate glass, spin-on glass (SOG), silicon oxide, P-doped silicon oxide (P-glass), and silicon nitride, for example $SiO_2$, $Si_3N_4$, $Al_2O_3$, $SiO_xN_y$, etc. Each ONO structure comprises a nitride layer 217 sandwiched between a bottom oxide layer and a top oxide layer. The charge trapping layer is located above the channel 215, as well as over the ends of the source/drain regions 248. On top of the charge trapping layer lies a conductive connecting block 226, which functions as a gate conductor. On top of the bit lines 248 and ONO structures 216 lie bit line dielectrics 250, which function as insulators. In this embodiment, the conductive connecting block 226 overlays and covers only the gate oxide layer 220.

Reference is now made to FIGS. 15–20, which illustrate the NROM fabrication method according to a second embodiment of the present invention. The process begins by growing a thick oxide layer 221 on a substrate 210, preferably to a thickness of 150–200 Å, in a low temperature oxidation operation. A preferred oxidation temperature is about 800 degrees C., but it can vary between 750 and 1000 degrees C. The substrate 210 is preferably a P-type silicon substrate of a <100> crystal lattice orientation.

Figure 15:
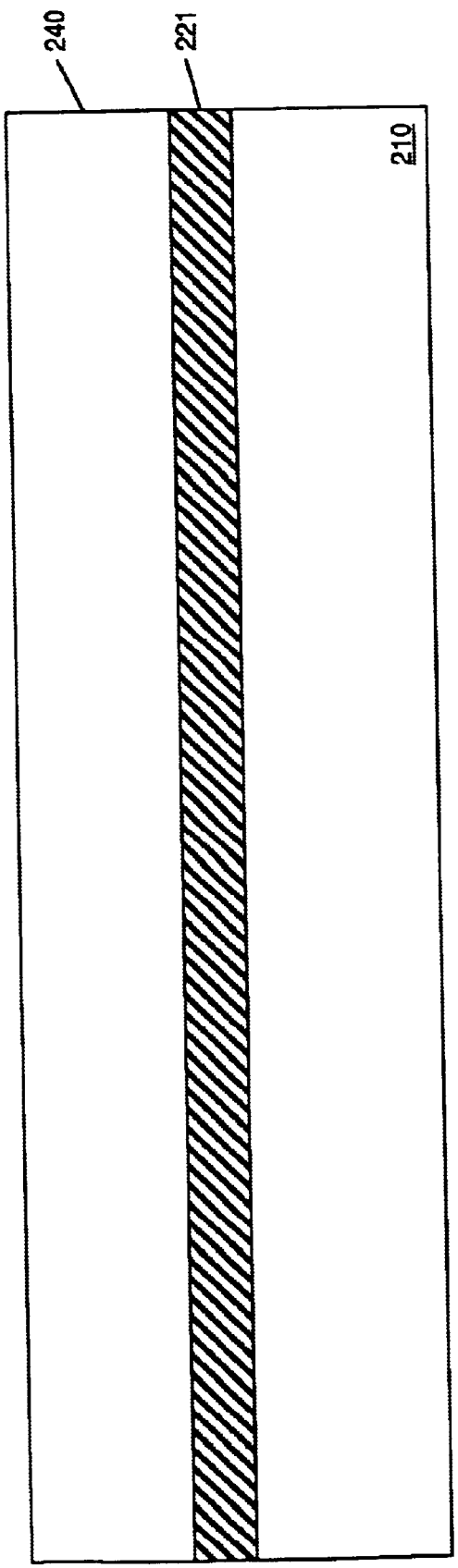
FIG. 15–20 illustrate sectional views of the NROM cell of FIG. 14, taken during various process steps of the fabrication thereof.

Then, a first conducting layer 240 is deposited over the wafer to a depth of 3000–5000 Å, resulting in the structure in FIG. 15. The first conducting layer is preferably polycrystalline silicon, more preferably doped polysilicon.

Figure 16A:
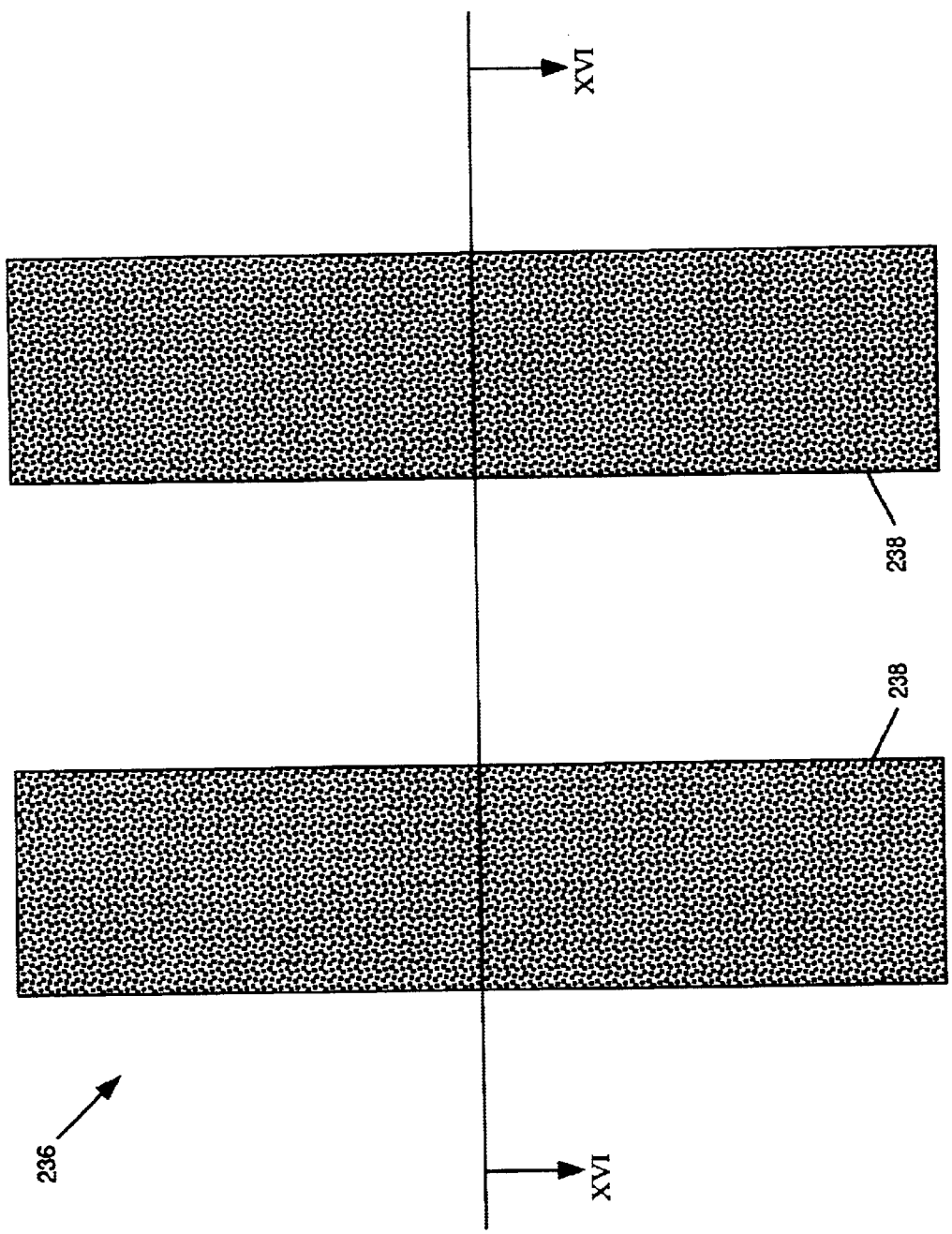
Figure 16B:
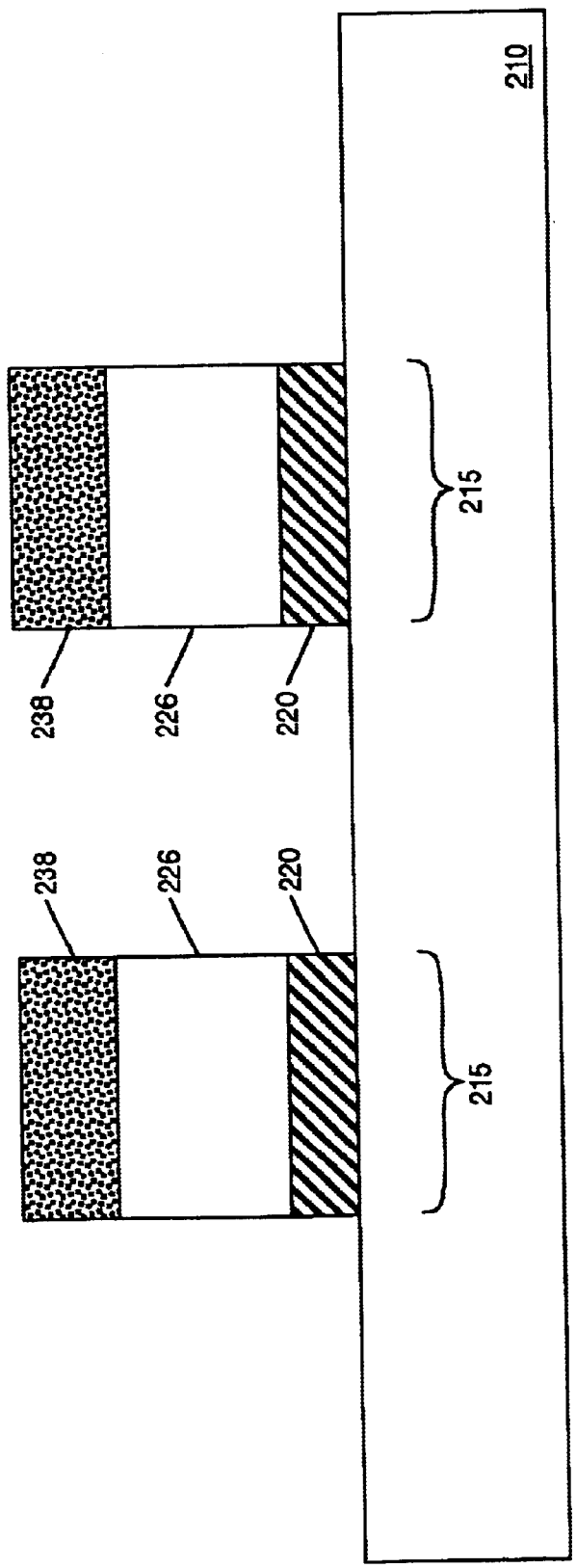
Figure 16C:
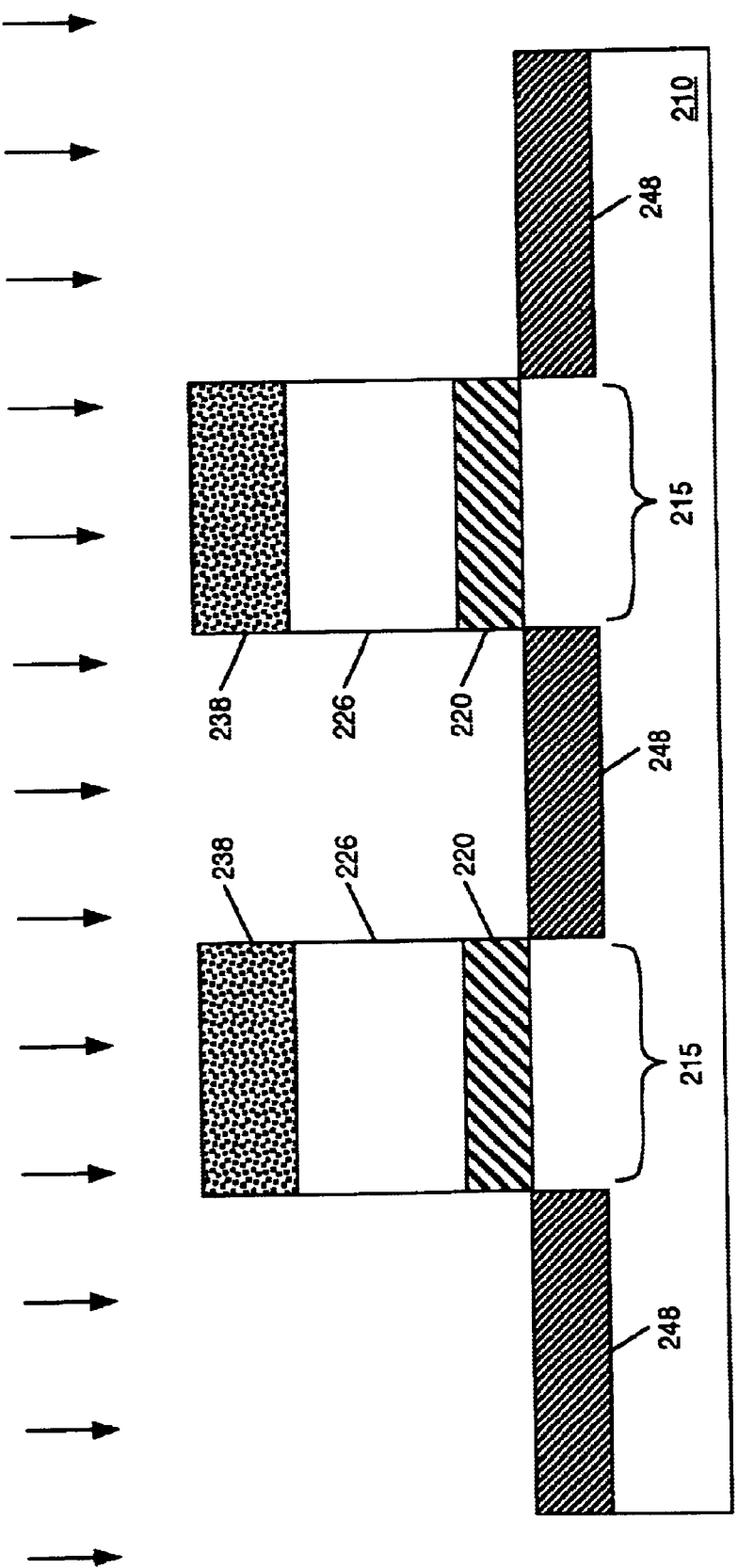

The next step involves depositing a photoresist layer and patterning it into columns 238 to form a bit line mask 236, whose layout within the memory array portion of the chip is shown from above in FIG. 16A. Prior to implanting the bit lines, the thick oxide and first conducting layers 221 and 240, respectively, are etched away from the areas between photoresist columns 238 to form conductive connecting blocks 226 superposed on gate oxide layers 220. The conductive connecting blocks 226 and gate oxide layers 220 are self-aligned with respect to the side edges of the overlying photoresist columns 238, as illustrated in FIG. 16B.

After the etch operation, bit lines 248 are implanted (FIG. 16C) in the areas between the photoresist columns 138. A typical implant might be $2-4*10^{15}/cm^2$ of Arsenic at 50 Kev. It will be appreciated that this is a self-aligned implant in which the bit lines 248 are self-aligned to the photoresist columns 238. In addition, the bit line regions 248 are elongate and are associated with other cells in the columns of the memory array. Next, the first photoresist layer 238 is stripped and the surface is cleaned.

Figure 17:
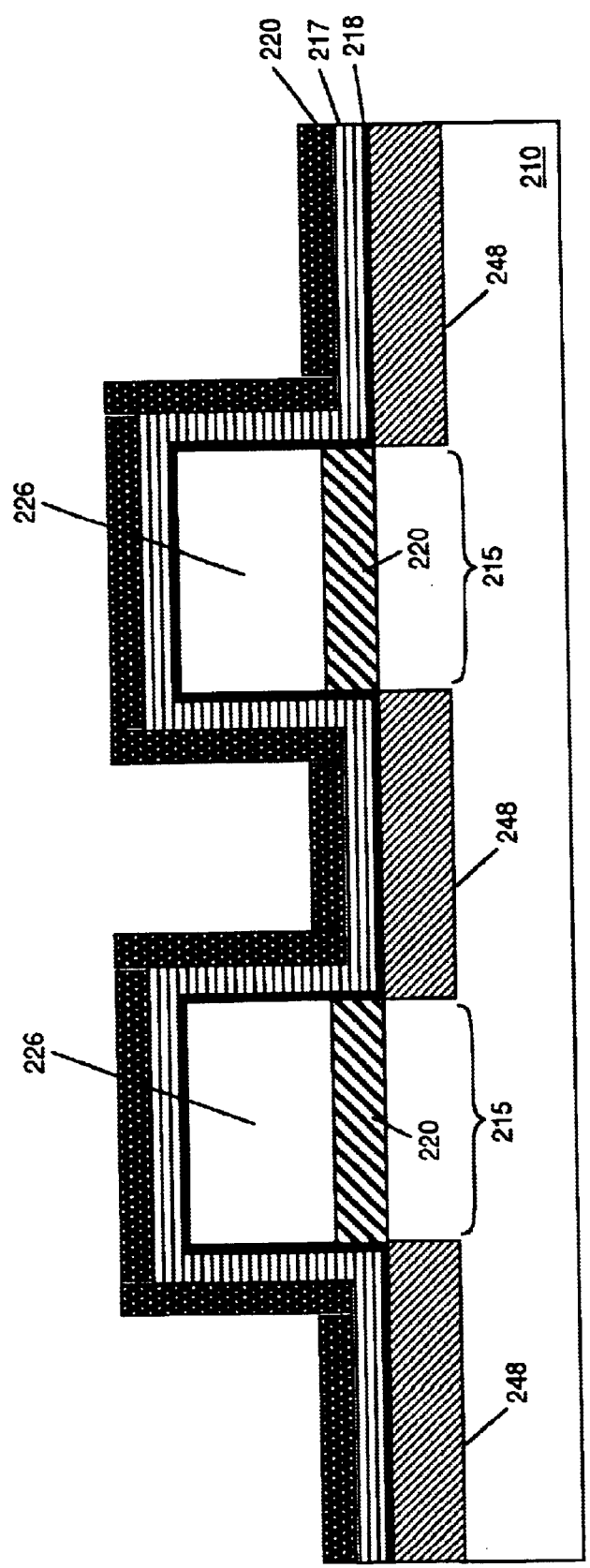

A lower oxide layer 218 is then grown over the chip, preferably to a thickness of 10–50 Å in a low temperature oxidation operation. A preferred oxidation temperature is about 800° C., but it can vary between 750–1000° C. A silicon nitride layer 217 is next deposited over the thin oxide layer 218 in a low temperature chemical vapor deposition (LPCVD) operation to a thickness of 50–70 Å. The LPCVD operation is preferably conducted at a temperature of 650–750° C. and a pressure of 0.05–0.3 Torr using a gas mixture of $NH_3$ and $SiCl_2H_2$. Preferably, the temperature is 725° C. and the pressure is 0.2 Torr. Then, an upper oxide layer 220 is grown over the nitride layer 217 to a depth of 50–150 Å. The resulting structure is depicted in FIG. 17.

Figure 18:
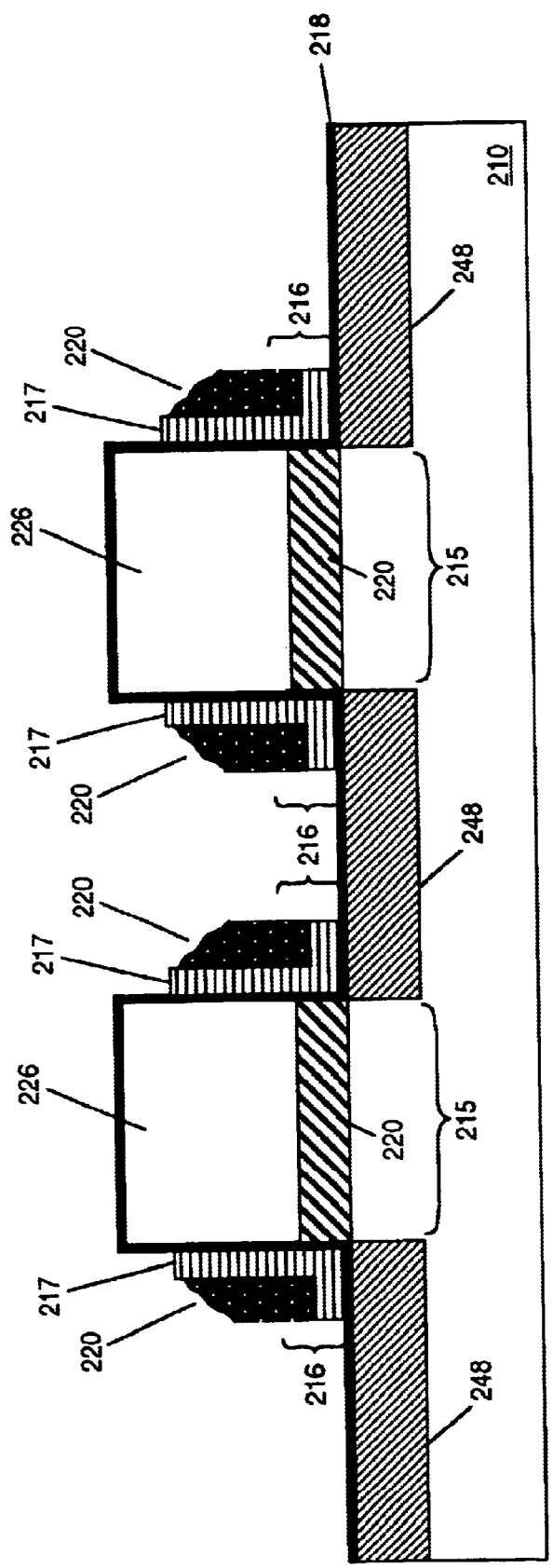
Figure 19:
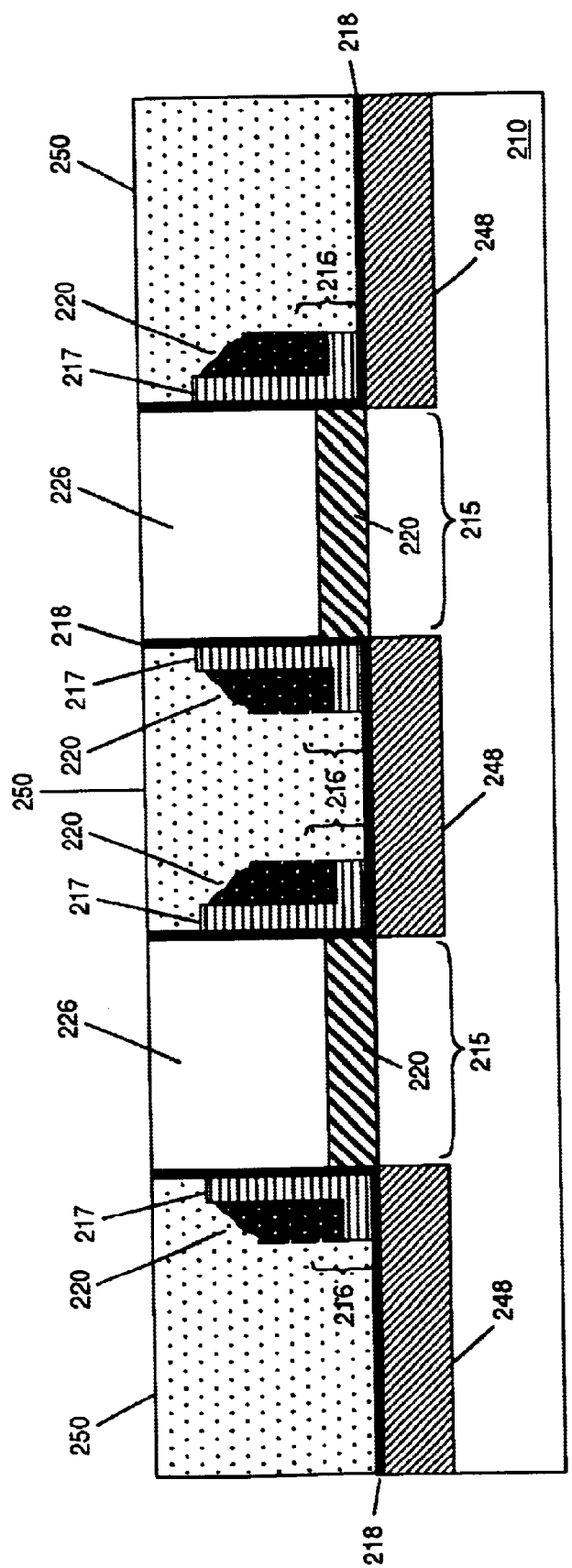

Afterwards, an isotropic etch is performed to remove the upper oxide, nitride, and lower oxide layers 220, 217, and 218, respectively, from the surface of the chip except for the regions adjacent to the conductive connecting blocks 226. As shown in FIG. 18, this etch generates a charge trapping layer located above a channel 115. The charge-trapping layer comprises a pair of oxide-nitride-oxide (ONO) columns 216 separated by a gate oxide 220, wherein each ONO column comprises a nitride layer 217 sandwiched between a lower oxide layer 218 and an upper oxide layer 220. The conductive connecting block 226 overlays and covers only the gate oxide 220.

The process continues with the deposition of a dielectric layer, preferably conformal silicon oxide, over the surface of the chip to a depth of 4000–6000 Å. Preferably, the deposition uses a high-density plasma or a conventional CVD method, for example, the thermal decomposition of tetraethyl orthosilicate (TEOS). Chemical mechanical polishing (CMP) is then employed to uniformly remove material in a downward direction until the conductive connecting blocks 226 are reached. The result is a planarized surface of the memory array, with bit line dielectrics 250 formed over the bit lines 248, illustrated in FIG. 19.

Figure 20A:
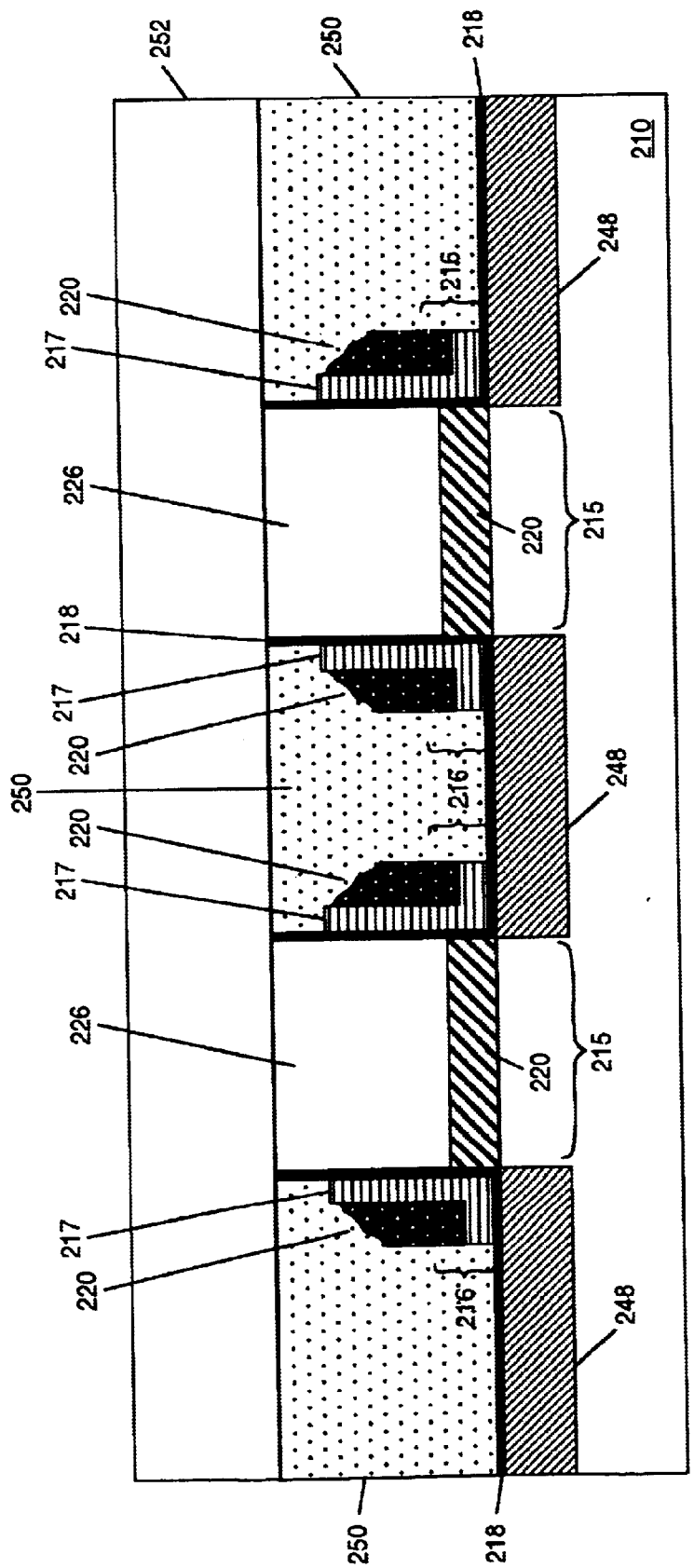
Figure 20B:
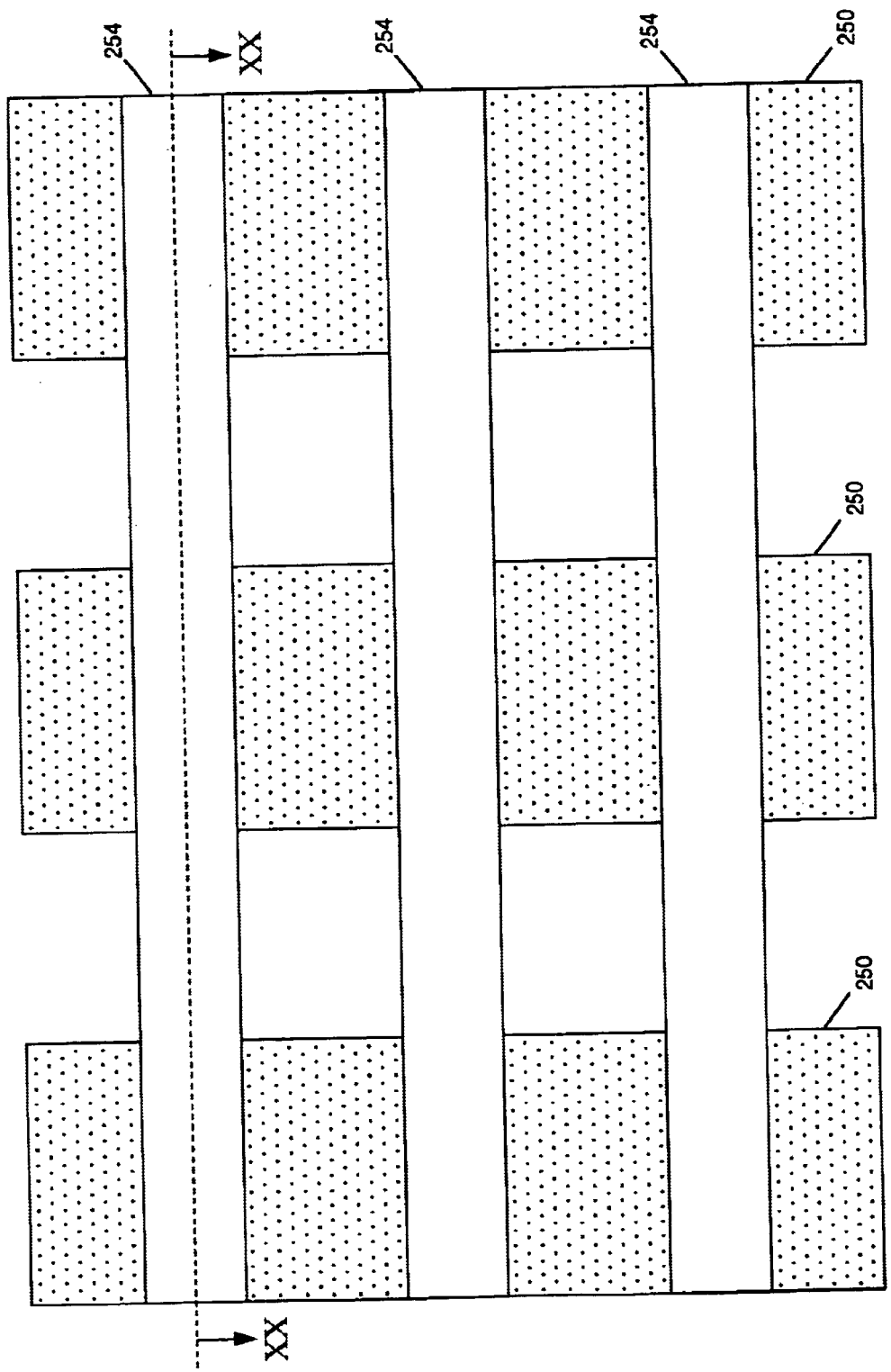

With reference now to FIG. 20A, a second conducting layer 252, preferably polycrystalline silicon, more preferably doped polysilicon, is deposited over the surface of the chip. Then, the conductive connecting blocks 226 and second conducting layer 252 are concurrently patterned to define a word line 254 (FIG. 20B) extending in common with a number of other memory cells of the row. Importantly, the word line 254 is in electrical contact with the first conductive layer 240 forming the conductive connecting blocks 226. Thus, when an address signal is applied to the word line 254, such signal is applied simultaneously to the conductive connecting blocks 226, which function as gate conductors. All memory cells connected to the word line 254 which are not programmed with a concentrated charge on the silicon nitride layer 217 will conduct and present a low impedance between the associated pair of bit lines. Those memory cells in the row which are programmed so as to have a concentrated charge on the silicon nitride layer 217 will not be made conductive and thus will present a high impedance between the associated bit lines.

It is noted that the present invention covers the fabrication of the entire chip which NFQ includes the NROM memory array portion and the complementary metal oxide semiconductor (CMOS) periphery devices.

The individual processing steps for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; and Microchip Fabrication $3^{rd}$ edition, Peter Van Zant, McGraw-Hill, 1997.

The dielectric layer may be deposited by conventional methods known to those of ordinary skill in the art, such as by spin-on methods, sintering (which may further include sol-gel oxide formation), chemical vapor deposition, etc. A glass layer deposited by a chemical vapor deposition technique may be subject to a glass reflow step (e.g., by heating) to smooth, densify and further improve the contact between the protection layer and the substrate.

Etching of deposited films may be conducted by conventional methods known to those of ordinary skill in the art. The specific etching methods and materials depend on the material being removed, the resist material and the compatibility of the etching material with the existing structure. Selection of suitable etching materials, resist materials and etching conditions is within the level of ordinary skill in the art.

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; a nonvolatile memory device, etc. Furthermore, any of the semiconductor devices may be incorporated into an electronic device (e.g. a computer, an airplane, a mobile telephone, or an automobile).

Thus, there has been disclosed in accordance with the invention, an apparatus and method for creating a semiconductor structure that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications that fall within the scope of the appended claims and equivalents thereof.

What is claimed is:

1. A method of forming a semiconductor structure, comprising:
    forming a charge-trapping structure on a substrate;
    wherein said charge-trapping structure comprises:
    (i) a first ONO structure on a first portion of said substrate:
    (ii) a second ONO structure on a second portion of said substrate, wherein said first portion does not completely overlap said second portion; and
    (iii) a gate oxide between said first and second ONO structures; and
        said ONO structures comprise a nitride layer between a first oxide layer and a second oxide layers and are formed by:
            forming an oxide-conductive layer on said substrate, said oxide-conductive layer comprising a first conductive layer on a thick oxide layer;
            laying down a bit line mask of photoresist, said bit line mask formed generally in columns at least within a memory portion of said substrate;
            removing at least a portion of said oxide-conductive layer wherever said photoresist is not present to form oxide-conductive-layer columns comprising said gate;
            implanting bit lines wherever said photoresist is not present and generally in columns;
            removing said photoresist;
            removing a portion of said remaining thick oxide layer from said oxide-conductive-layer columns to form a recess and said gate oxide;
            growing a thin oxide layer over said memory portion of said substrate, the portion of said thin oxide layer in the lower region of said recess forming said first oxide layer and the portion of said thin oxide layer in the upper region of said recess forming said second oxide layer;
            depositing a nitride layer over said thin oxide layer to a thickness sufficient to fill said recess; and
            removing said nitride layer except in the region of said recess to form said ONO structures.

2. The method of claim 1, further comprising:
    forming bit line dielectrics on said bit lines; and
    removing said thin oxide layer from the top surface of said oxide-conductive-layer columns.

3. The method of claim 2, further comprising depositing a second conductive layer on said substrate.

4. The method of claim 3, further comprising concurrently etching said first and second conductive layers to form word lines perpendicular to and on said bit line dielectrics and said oxide-conductive-layer columns.

5. A method of forming a semiconductor device, comprising:
    making a semiconductor structure by the method of claim 1; and
    forming a semiconductor device from said semiconductor structure.

6. A method of making an electronic device, comprising:
    making a semiconductor device by the method of claim 5; and forming an electronic device comprising said semiconductor device.

7. A method of forming a semiconductor device, comprising:
    making a semiconductor structure by the method of claim 1; and
    forming a semiconductor device from said semiconductor structure.

8. A method of making an electronic device, comprising:
    making a semiconductor device by the method of claim 7; and forming an electronic device comprising said semiconductor device.

9. A method of forming a semiconductor structure, comprising:
    forming a charge-trapping structure on a substrate;
    wherein said charge-trapping structure comprises:
    (i) a first ONO structure on a first portion of said substrate;
    (ii) a second ONO structure on a second portion of said substrate, wherein said first portion does not completely overlap said second portion; and
    (iii) a gate oxide between said first and second ONO structures; and
        said ONO structures comprise a nitride layer between a first oxide layer and a second oxide layer and are formed by:
            forming an oxide-conductive layer on said substrate, said oxide-conductive layer comprising a first conductive layer on a thick oxide layer;
            laying down a bit line mask of photoresist, said bit line mask formed generally in columns at least within a memory portion of said substrate;
            removing at least a portion of said oxide-conductive layer wherever said photoresist is not present to form oxide-conductive layer columns comprising said gate on said gate oxide;
            implanting bit lines wherever said photoresist is not present and generally in columns;
            removing said photoresist; and
            forming an ONO layer within said memory portion of said substrate, said ONO layer comprising said nitride layer between said first oxide layer and said second oxide layer;

removing said ONO layer except from the regions adjacent to said oxide-conductive-layer columns to form said ONO structures.

10. The method of claim 9, further comprising:

forming bit line dielectrics on said bit lines and said ONO structures; and removing said thin oxide layer from the top surface of said oxide-conductive-layer columns.

11. The method of claim 10, further comprising depositing a second conductive layer on said substrate.

12. The method of claim 11, further comprising concurrently etching said first and second conductive layers to form word lines perpendicular to and on said bit line dielectrics and said oxide-conductive-layer columns.

13. A method of forming a semiconductor device, comprising:

making a semiconductor structure by the method of claim 9; and forming a semiconductor device from said semiconductor structure.

14. A method of making an electronic device, comprising:

making a semiconductor device by the method of claim 9; and forming an electronic device comprising said semiconductor device.

15. A method of forming a semiconductor structure, comprising;

forming a charge-trapping structure on a substrate; wherein said charge-trapping structure comprises:

(i) a first ONO structure on a first portion of said substrate;

(ii) a second ONO structure on a second portion of said substrate, wherein said first portion does not completely overlap said second portion; and (iii) a gate oxide between said first and second ONO structures; and said ONO structures comprise a nitride layer between a first oxide layer and a second oxide layer and are formed by:

forming an oxide-conductive layer on said substrate, said oxide-conductive layer comprising a first conductive layer on a thick oxide layer;

within a memory portion of said substrate, removing at least a portion of said oxide-conductive layer to form oxide-conductive-layer columns comprising said gate;

implanting bit lines between said oxide-conductive-layer columns;

removing a portion of said remaining thick oxide layer from said oxide-conductive-layer columns to form a recess and said gate oxide;

growing a thin oxide layer over said memory portion of said substrate, wherein the portion of said thin oxide layer in the lower region of said recess forms said first oxide layer and the portion of said thin oxide layer in the upper region of said recess forms said second oxide layer;

depositing a nitride layer over said thin oxide layer to a thickness sufficient to fill said recess; and removing said nitride layer except in the region of said recess to form said ONO structures.

16. The method of claim 15, further comprising:

forming bit line dielectrics on said bit lines; and removing said thin oxide layer from the top surface of said oxide-conductive-layer columns.

17. The method of claim 16, further comprising depositing a second conductive layer on said substrate.

18. The method of claim 17, further comprising concurrently etching said first and second conductive layers to form word lines perpendicular to and on said bit line dielectrics and said oxide-conductive-layer columns.

19. A method of forming a semiconductor structure, comprising:

forming a charge-trapping structure on a substrate; wherein said charge-trapping structure comprises:

(i) a first ONO structure on a first portion of said substrate;

(ii) a second ONO structure on a second portion of said substrate, wherein said first portion does not completely overlap said second portion; and (iii) a gate oxide between said first and second ONO structures; and said ONO structures comprise a nitride layer between a first oxide layer and a second oxide layer and are formed by forming an oxide-conductive layer on said substrate, said oxide-conductive layer comprising a first conductive layer on a thick oxide layer;

within a memory portion of said substrate, removing at least a portion of said oxide-conductive layer to form oxide-conductive layer columns comprising said gate on said gate oxide;

implanting bit lines between said oxide-conductive layer columns;

forming an ONO layer within said memory portion of said substrate, said ONO layer comprising said nitride layer between said first oxide layer and said second oxide layer; and removing said ONO layer except from the regions adjacent to said oxide-conductive-layer columns to form said ONO structures.

20. The method of claim 19, further comprising:

forming bit line dielectrics on said bit lines and said ONO structures; and removing said thin oxide layer from the top surface of said oxide-conductive-layer columns.

21. The method of claim 20, further comprising depositing as second conductive layer on said substrate.

22. The method of claim 21, further comprising concurrently etching said first and second conductive layers to form word lines perpendicular to and on said bit line dielectrics and said oxide-conductive-layer columns.

* * * * *